United States Patent
Watanabe et al.

(10) Patent No.: US 9,257,809 B2
(45) Date of Patent: Feb. 9, 2016

(54) LASER DEVICE FOR EXPOSURE APPARATUS

(75) Inventors: Hidenori Watanabe, Oyama (JP); Hiroshi Tanaka, Oyama (JP); Osamu Wakabayashi, Hiratsuka (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 13/401,734

(22) Filed: Feb. 21, 2012

(65) Prior Publication Data

US 2012/0236885 A1 Sep. 20, 2012

Related U.S. Application Data

(63) Continuation of application No. PCT/JP2011/053566, filed on Feb. 18, 2011.

(30) Foreign Application Priority Data

Feb. 22, 2010 (JP) .................................. 2010-036662

(51) Int. Cl.
| | |
|---|---|
| H01S 3/223 | (2006.01) |
| H01S 3/03 | (2006.01) |
| H01S 3/134 | (2006.01) |
| H01S 3/23 | (2006.01) |
| H01S 3/036 | (2006.01) |
| G03F 7/20 | (2006.01) |

(52) U.S. Cl.
CPC .............. *H01S 3/03* (2013.01); *G03F 7/70025* (2013.01); *H01S 3/036* (2013.01); *H01S 3/134* (2013.01); *H01S 3/2316* (2013.01); *H01S 3/2366* (2013.01)

(58) Field of Classification Search
CPC .......... H01S 3/036; H01S 3/104; H01S 3/134

USPC .................... 372/59, 29.02, 31, 55
See application file for complete search history.

(56) References Cited

U.S. PATENT DOCUMENTS 4,804,978 A 2/1989 Tracy
5,105,269 A * 4/1992 Nakamura et al. ............ 348/162
(Continued)

FOREIGN PATENT DOCUMENTS

JP S64-018285 A 1/1989
JP H03-276686 A 12/1991
(Continued)

OTHER PUBLICATIONS

An Office Action; "Notice of Reasons for Rejection," issued by the Japanese Patent Office on Aug. 18, 2015, which corresponds to Japanese Patent Application No. 2012-500669 and is related to U.S. Appl. No. 13/401,734; with English language translation.

*Primary Examiner* — Tod T Van Roy
(74) *Attorney, Agent, or Firm* — Studebaker & Brackett PC

(57) ABSTRACT

A laser device for an exposure apparatus may include: a MOPA-type or MOPO-type laser device including a seed laser and at least one gas discharge-pumped amplifier stage that receives output light from the seed laser as an input, amplifies the light, and outputs the amplified light; and at least one of a laser gas control device that at least changes the total pressure of a laser gas in said amplifier stage in accordance with requested energy and a laser power source control device that at least changes pump intensity of discharge electrodes in said amplifier stage in accordance with said requested energy, in a case where the energy of laser output light from said laser device is to be changed discontinuously in response to a request from an exposure apparatus.

20 Claims, 30 Drawing Sheets

(56) References Cited

U.S. PATENT DOCUMENTS

| | | |
|---|---|---|
| 5,450,436 A | 9/1995 | Miyazono et al. |
| 5,642,374 A * | 6/1997 | Wakabayashi et al. ......... 372/57 |
| 6,490,307 B1 | 12/2002 | de Mos et al. |
| 2002/0196823 A1* | 12/2002 | Nakao et al. .................... 372/32 |
| 2003/0098959 A1 | 5/2003 | Hagiwara et al. |
| 2005/0185690 A1* | 8/2005 | Rule et al. ........................ 372/55 |
| 2006/0146900 A1* | 7/2006 | Jacques et al. ................ 372/38.1 |
| 2006/0239309 A1* | 10/2006 | Ariga et al. ............... 372/29.021 |
| 2008/0291962 A1* | 11/2008 | Govorkov et al. .............. 372/57 |
| 2009/0299693 A1* | 12/2009 | Kane et al. .................... 702/179 |

FOREIGN PATENT DOCUMENTS

| | | |
|---|---|---|
| JP | H04-199756 A | 7/1992 |
| JP | H04-252013 A | 9/1992 |
| JP | H06-164026 A | 6/1994 |
| JP | H07-030184 A | 1/1995 |
| JP | H07-335961 A | 12/1995 |
| JP | H08-274399 A | 10/1996 |
| JP | H08-335741 A | 12/1996 |
| JP | H10-190103 A | 7/1998 |
| JP | 2000-294857 A | 10/2000 |
| JP | 2001-326159 A | 11/2001 |
| JP | 2002-223020 A | 8/2002 |
| JP | 2003-008119 A | 1/2003 |
| JP | 2005-064184 A | 3/2005 |
| JP | 2005-525001 A | 8/2005 |
| JP | 2007-059788 A | 3/2007 |
| JP | 2008-311340 A | 12/2008 |
| WO | 03/100826 A1 | 12/2003 |

\* cited by examiner

LASER DEVICE FOR EXPOSURE APPARATUS

CROSS-REFERENCE TO RELATED APPLICATIONS

The present application is a continuation of International Application PCT/JP2011/53566, with an international filing date of Feb. 18, 2011, which claims priority from Japanese Patent Application No. 2010-036662 filed Feb. 22, 2010.

BACKGROUND

1. Technical Field

This disclosure relates to laser devices for exposure apparatuses.

2. Related Art

There exists a MOPA-type or MOPO-type laser device for an exposure apparatus which includes a seed laser and at least one gas discharge-pumped amplifier stage that receives light outputted from the seed laser as its input, amplifies the light, and outputs the amplified light.

SUMMARY

A laser device for an exposure apparatus according to one aspect of this disclosure may include: a MOPA-type or MOPO-type laser device including a seed laser and at least one gas discharge-pumped amplifier stage that receives output light from the seed laser as an input, amplifies the light, and outputs the amplified light; and at least one of a laser gas control device that at least changes the total pressure of a laser gas in said amplifier stage in accordance with requested energy and a laser power source control device that at least changes pump intensity of discharge electrodes in said amplifier stage in accordance with said requested energy, in a case where the energy of laser output light from said laser device is to be changed discontinuously in response to a request from an exposure apparatus.

DESCRIPTION OF EMBODIMENTS

Figure 1:
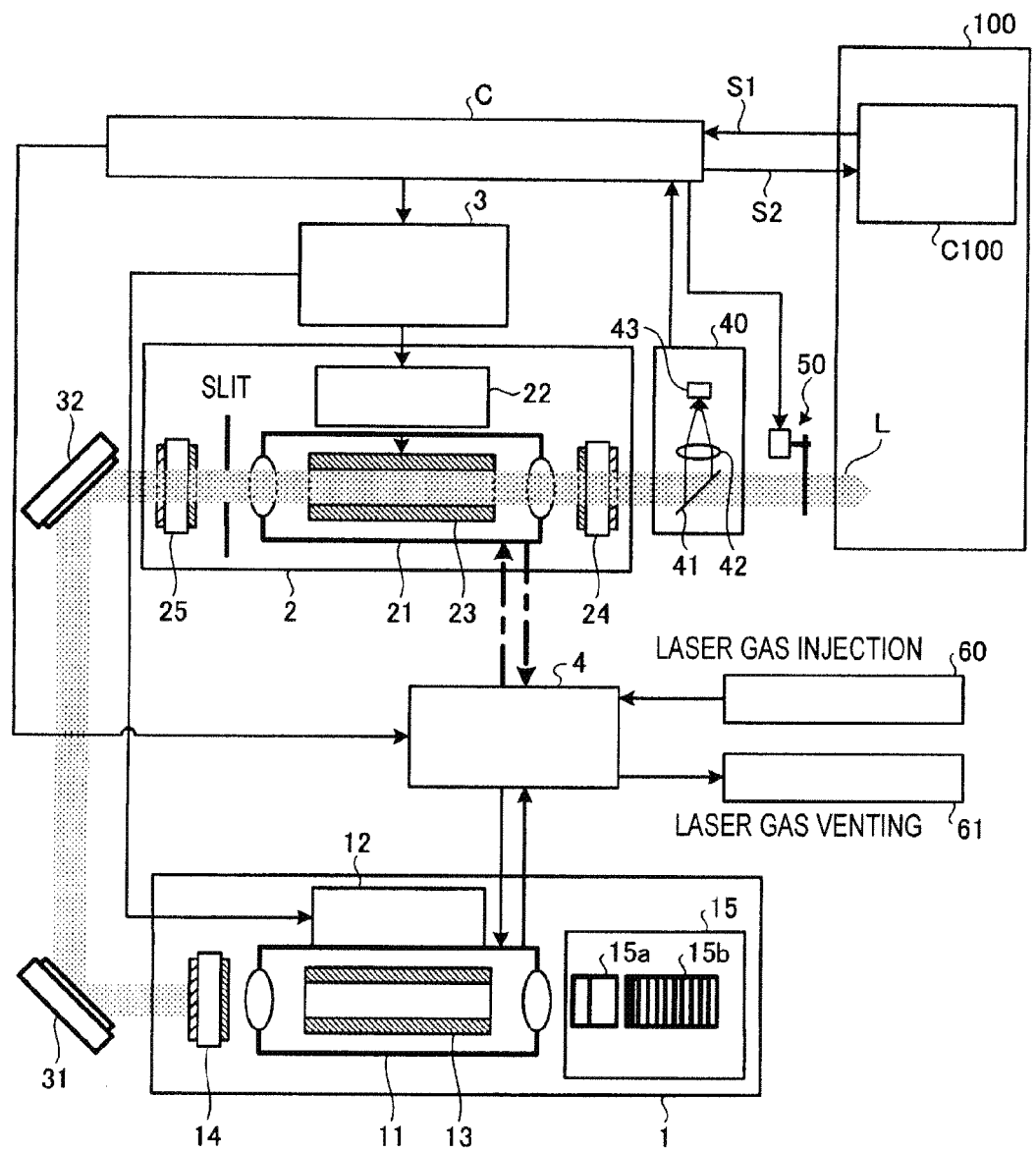
FIG. 1 schematically illustrates the configuration of a laser device for an exposure apparatus according to a first embodiment of this disclosure.

Embodiments of the present disclosure will be described in detail hereinafter with reference to the drawings. The embodiments described hereinafter represent examples of the present disclosure, and are not intended to limit the content of the present disclosure. Furthermore, not all of the configurations and operations described in the embodiments are required configurations and operations in the present disclosure. Note that identical constituent elements will be given identical reference numerals, and duplicate descriptions thereof will be omitted.

In recent years, the necessity for higher outputs in laser devices combined with exposure optimization in exposure apparatuses has led to demand for changing laser output in accordance with exposure processes. However, providing multiple laser devices for respective laser outputs required by the exposure processes leads to an increase in costs. Therefore, in order for a single laser device to be able to handle many exposure processes, it is necessary to increase the possible range of output, or in other words, the energy dynamic range, of the single laser device.

First Embodiment

First, the configuration of a laser device for an exposure apparatus, according to a first embodiment of this disclosure, will be described. FIG. 1 schematically illustrates the configuration of the laser device for the exposure apparatus according to the first embodiment. As shown in FIG. 1, this laser device for an exposure apparatus is a MOPA (Master Oscillator Power Amplifier) type or MOPO (Master Oscillator Power Oscillator) type laser device that includes a seed laser 1 and at least one gas discharge-pumped amplifier stage 2 that receives the light outputted by the seed laser 1 as its input, amplifies the light, and outputs the amplified light. Note that in the MOPA type, a resonator is not provided in the amplifier stage 2. The MOPO type device, meanwhile, is also referred to as an injection lock type device, in which a resonator is provided in the amplifier stage 2. Note that the seed laser 1 and the amplifier stage 2 may be joined by an optical system having at least two high-reflecting mirrors 31 and 32 therebetween.

In addition, the laser device for an exposure apparatus may include a laser controller C that sends and receives control signals to and from an exposure apparatus controller C100 of an exposure apparatus 100, and may control the laser device for an exposure apparatus as a whole. A laser power source control device 3 and a laser gas control device 4 may be connected to the laser controller C.

The laser power source control device 3 may be connected to an MO power source 12, which is a power source for the seed laser 1, and to a PO power source 22, which is a power source for the amplifier stage 2. The MO power source 12 and the PO power source 22 may be pulsed power sources. Generally, a pulsed power source primarily includes a charger and a pulse compression circuit. The laser power source control device 3 may cause the laser device to oscillate in bursts by causing the power sources to generate voltages such that laser light of an energy requested by the exposure apparatus 100 is outputted. The laser gas control device 4 may control the laser gas pressure within a chamber 11 of the seed laser 1 and the laser gas pressure within a chamber 21 of the amplifier stage 2.

When the output energy of the laser device has been changed discontinuously based on commands from the exposure apparatus 100, the laser power source control device 3 changes, under the control of the laser controller C, the pump intensity of discharge electrodes 23 in the amplifier stage 2 in accordance with the energy requested by the exposure apparatus 100. In the case where a command d for changing the laser output energy discontinuously has been outputted from the exposure apparatus 100, the laser controller C, which has received the command d, supplies a command c to the laser power source control device 3. The laser power source control device 3, which has received the command c, controls at least one of the MO power source 12 and the PO power source 22. The MO power source 12 may apply a voltage between a pair of discharge electrodes 13 as a result of this control. In addition, the PO power source 22 may apply a voltage between a pair of discharge electrodes 23. Furthermore, when the command d that causes the laser output energy to change discontinuously has been outputted from the exposure apparatus 100, gas control may be carried out by the laser gas control device 4. This gas control causes the total pressure of the laser gas in the amplifier stage 2 to change in accordance with the energy requested by the exposure apparatus 100. Note that either one or both of the controls performed by the laser power source control device 3 and the laser gas control device 4 may be carried out.

The seed laser 1 may be a gas discharge-pumped laser or a solid-state laser. In the case where the seed laser 1 is a gas discharge-pumped laser, the seed laser 1 may include the chamber 11 into which a laser gas is injected, the MO power source 12, and a resonator that outputs to the exterior some light generated in the chamber 11 as a result of the laser gas being excited and causes the remaining light to resonate via the chamber 11. The resonator is formed between a line narrowing module 15, which includes an expanding prism 15a and a grating 15b, and an output coupler 14. The chamber 11 may include the pair of discharge electrodes 13 that form a gain region by exciting the laser gas. A charging voltage from the MO power source 12 is applied between this pair of discharge electrodes 13.

The amplifier stage 2 may be a gas discharge-pumped laser. The amplifier stage 2 may include the chamber 21 into which a laser gas is injected, the PO power source 22, and a resonator that outputs to the exterior some light generated in the chamber 21 as a result of the laser gas being excited and causes the remaining light to resonate via the chamber 21. This resonator is formed by a rear mirror 25 and a front mirror 24. FIG. 1 illustrates an example of a Fabry-Perot resonator in which the planar rear mirror 25 and the planar front mirror 24 are disposed parallel to each other. The chamber 21 may include the pair of discharge electrodes 23 that define a gain region. A voltage from the PO power source 22 is applied between this pair of discharge electrodes 23, whereby the laser gas is excited.

Note that the laser gas within the chambers 11 and 21 may, in the case of an excimer laser, be a composition gas (Kr gas and $F_2$ gas, in the case of KrF, and Ar gas and $F_2$ gas, in the case of ArF) and a diluent buffer gas (Ne or He gas).

An energy sensor unit 40 may be provided in the light path on the laser light output side of the amplifier stage 2. The energy sensor unit 40 may include a beam splitter 41 that extracts part of the output laser light L, an optical sensor 43 such as a photodiode, and a collecting lens 42 for focusing the light from the beam splitter 41 onto the optical sensor 43. The energy sensor unit 40 may measure the energy of the laser light from the laser light L and reflected by the beam splitter 41.

Furthermore, a shutter 50 for preventing the output laser light L from entering the exposure apparatus 100 may be provided between the exposure apparatus 100 and the beam splitter 41. The shutter 50 may be closed during adjustment oscillation, which will be discussed later, when the laser output energy is changed discontinuously as a result of a command from the exposure apparatus 100, for example.

Note that a laser gas cylinder 60 and a venting unit 61 may be connected to the laser gas control device 4. An injection valve and a venting valve, not shown in the drawings, may be provided in the respective connection pipes. The laser gas cylinder 60 may supply the laser gas to the chambers 11 and 21 via the laser gas control device 4. The venting unit 61 may vent the laser gas from the chambers 11 and 21 via the laser gas control device 4.

Here, in the first embodiment, in the case where the laser output energy is changed discontinuously in response to a command from the exposure apparatus 100 using the laser gas control device 4 and the laser power source control device 3 under the control of the laser controller C, an adjustment oscillation sequence for changing the total pressure of the laser gas in the amplifier stage 2 and the voltage HV value is carried out. Furthermore, in the case where the discontinuous change increases the energy of the output laser light L, the amplification rate of the amplifier stage is raised without changing the output light energy of the seed laser 1. Carrying out such control makes it possible to suppress the degrading of the optical elements within the line narrowing module 15 due to the laser light.

Figure 2:
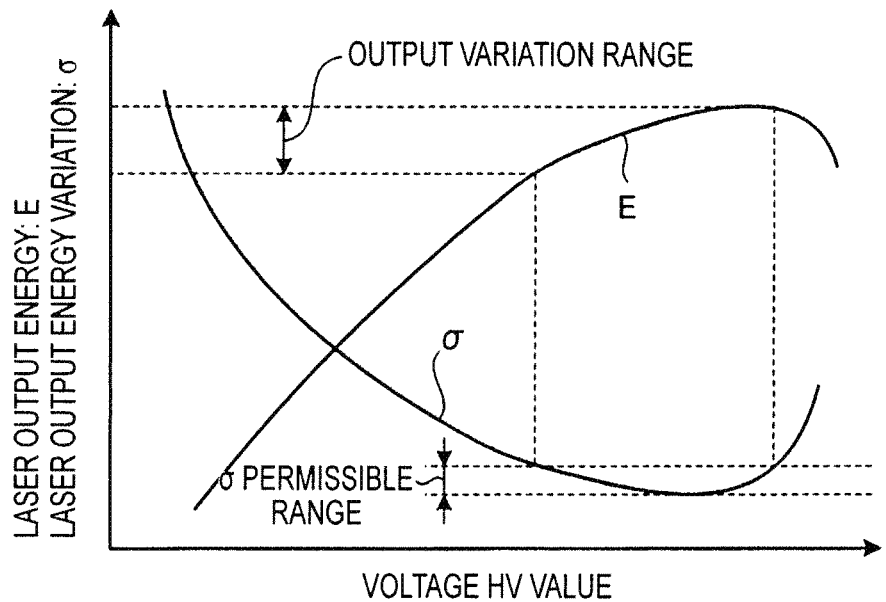
FIG. 2 illustrates dependencies of laser output energy and of laser output energy variation on voltage.

Incidentally, changing the pump intensity of the laser gas, or in other words, changing the voltage HV value, changing the gas composition, the gas pressure, and so on, can be considered as methods for causing the output of a single laser device to fluctuate. However, with a gas laser device, properties such as those shown in FIG. 2 are present in "voltage HV value–laser output energy E" and "voltage HV value–laser output energy variation σ." In other words, if the laser output energy E is changed using the voltage HV value, the laser output energy variation (variation in the oscillation pulse energy) σ may increase, and in some cases may exceed the permissible range.

In an exposure apparatus, it is necessary to reduce variations in the energy from pulse to pulse. Accordingly, the range of the laser output energy E that may vary drops in the case where the voltage HV value has been changed within the permissible range for the laser output energy variation σ requested by the exposure apparatus. That is, generally speaking, the laser output energy E can only be changed approximately ±10 W from the central output (nominal energy) if the laser output energy variation σ is to be kept approximately constant by the exposure apparatus. If an attempt is made to change the laser output energy E beyond that range, the laser output energy variation σ increases, and thus the laser device cannot be used as a light source for semiconductor exposure.

Meanwhile, even if the laser output energy variation σ is ignored, the laser stops oscillating when the voltage HV value is reduced to fall below a certain value and thus the required dynamic range cannot be obtained. The reason why the laser output energy variation σ increases when the voltage HV value is reduced is that the discharge becomes unstable and a uniform gain region cannot be secured as a result.

It should be noted that, as in the case where the voltage HV value is changed, in the case where an attempt is made to increase the dynamic range by changing the gas composition, the gas pressure, or the like, the laser output energy variation (variation in the oscillation pulse energy) σ may increase, and in some cases may exceed the permissible range. However, with respect to the gas pressure, the permissible range for the laser output energy variation is comparatively large in current laser devices manufactured by Gigaphoton, Inc.

Figure 3:
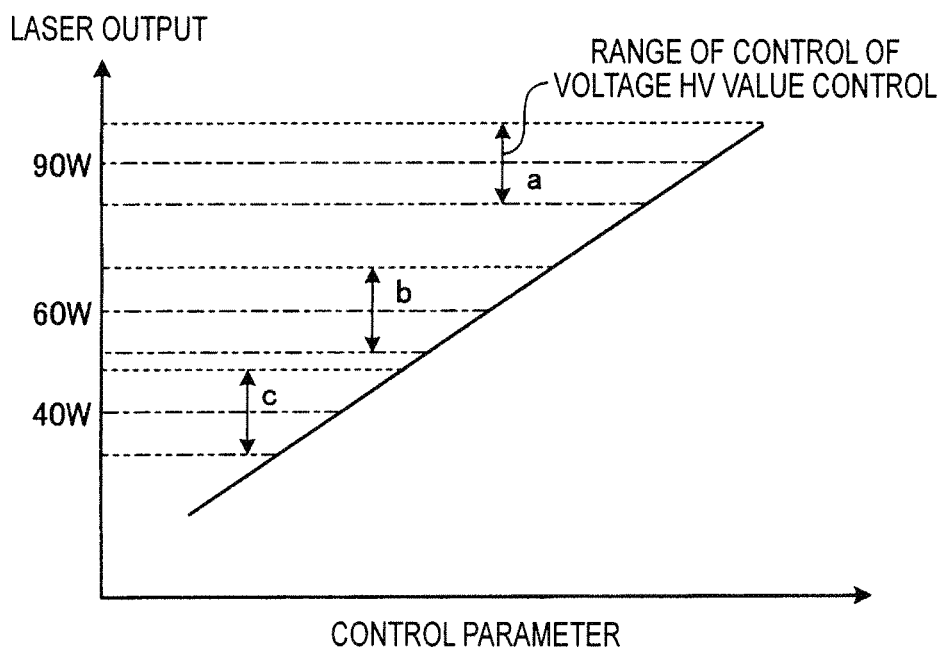
FIG. 3 illustrates a control range of voltage control.

FIG. 3 illustrates an example of the dynamic range of a requested laser output. With various types of exposure apparatuses that exist at present, a laser output within the range from approximately 90 W to 60 W is requested in the case of a 6 kHz laser device. However, the dynamic range when the output is changed using the voltage HV value becomes a range a of approximately 90±10 W for a laser device operating at 90 W and a range b of approximately 60±10 W for a laser device operating at 60 W. Thus, neither of these achieves the necessary dynamic range. Accordingly, it is difficult to achieve the requested range of the laser output through the change in the voltage HV value or the gas composition.

However, with laser devices manufactured by Gigaphoton, Inc., the gas pressure is a comparatively insensitive control parameter with respect to the laser output energy variation σ, as mentioned above. For this reason, making the gas pressure variable within an operating gas pressure range makes it possible for the laser device to output the nominal energy from 90 W to 60 W as well as ±10 W therefrom in a stable manner.

Accordingly, in the first embodiment, the laser controller C obtains information of the nominal energy for a certain exposure process from the exposure apparatus, and attempts to secure the necessary dynamic range by adjusting the gas pressure. In other words, the nominal energy is made variable while maintaining the energy stability within a permissible range by the laser gas control device 4 changing the gas pressure.

Figure 4:
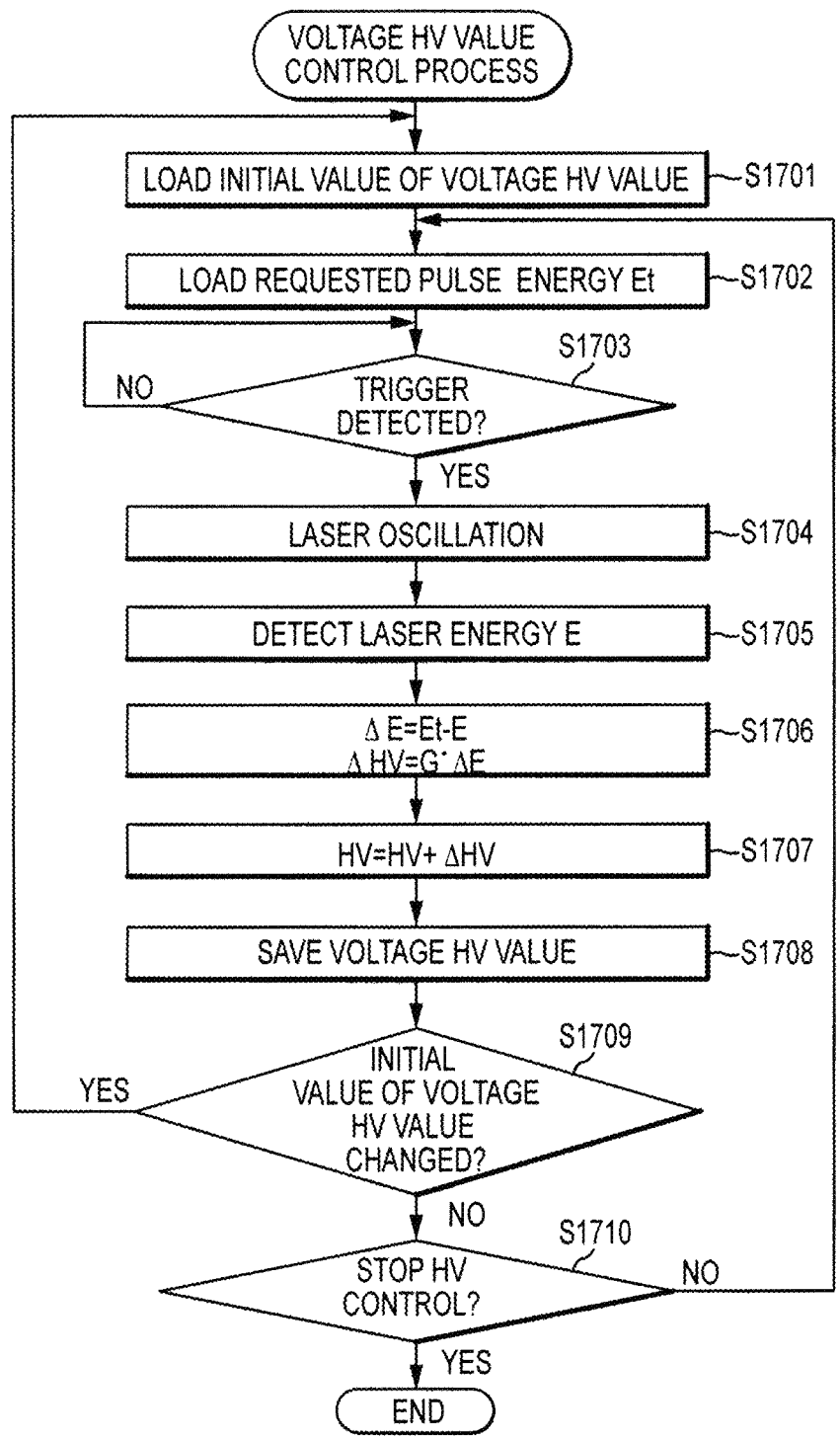
FIG. 4 is a flowchart illustrating a voltage HV value control process sequence performed by a laser controller C.

Note that as a prerequisite, the laser controller C may carry out the control of the voltage HV value in an independent manner. FIG. 4 is a flowchart illustrating a voltage HV value control process sequence performed by the laser controller C. The laser controller C may carry out the control of the voltage HV value when, for example, a command to carry out energy control of the laser device has been received from the exposure apparatus controller C100. In FIG. 4, first, the laser controller C may load the voltage HV value that corresponds to a requested pulse energy Et sent from the exposure apparatus controller C100 as an initial value (step S1701). Note that the voltage HV value that corresponds to the requested pulse energy Et may be stored as data in advance or may be obtained through calculations. The voltage HV value that corresponds to the requested pulse energy Et may also be determined in view of the gas pressure. After this, the laser controller C may load the requested pulse energy Et (step S1702). The laser controller C may then send, to the laser power source control device 3, a command to charge the PO power source 22 to the voltage HV value. After this, the laser controller C may determine whether or not a laser oscillation trigger signal sent from the exposure apparatus controller C100 has been detected (step S1703), and may stand by until the trigger signal is detected (step S1703, No). The laser controller C may then cause the laser device to oscillate via the laser power source control device 3 (step S1704) only in the case where the trigger signal has been detected (step S1703, Yes). After this, the laser energy E resulting from the laser oscillation may be detected via the energy sensor unit 40 (step S1705).

Thereafter, the laser controller C may calculate an energy fluctuation ΔE=Et−E. Furthermore, a voltage HV value fluctuation ΔHV=G·ΔE may be calculated (step S1706). Note that G represents control gain. Furthermore, the current voltage HV value may be updated as HV=HV+ΔHV (step S1707). Then, the updated voltage HV value may be saved (step S1708).

After this, it may be determined whether or not the initial value of the voltage HV value is to be changed (step S1709). For example, in the case where the requested pulse energy Et has changed by a large amount, the initial value of the voltage HV value may be changed. In addition, the initial value of the voltage HV value may be changed when an energy value command S1 has been sent from the exposure apparatus 100. In the case where the initial value of the voltage HV value is to be changed (step S1709, Yes), the process may move to step S1701, the initial value may be updated, and the aforementioned processes may be repeated. On the other hand, in the case where the initial value of the voltage HV value is not to be changed (step S1709, No), it may further be determined whether or not the process for controlling the voltage HV value (step S1710) is to be stopped. In the case where the control of the voltage HV value is not to be stopped (step S1710, No), the process may move to step S1702, and the aforementioned processes may be repeated using the current voltage HV value. On the other hand, in the case where the control of the voltage HV value is to be stopped (step S1710, Yes), this process may be ended. For example, the process for controlling the voltage HV value may be stopped when a command to stop the laser energy control is received from the exposure apparatus controller C100. In the process for controlling the voltage HV value, each time the voltage HV value is updated, the updated voltage HV value may be saved.

Figure 5:
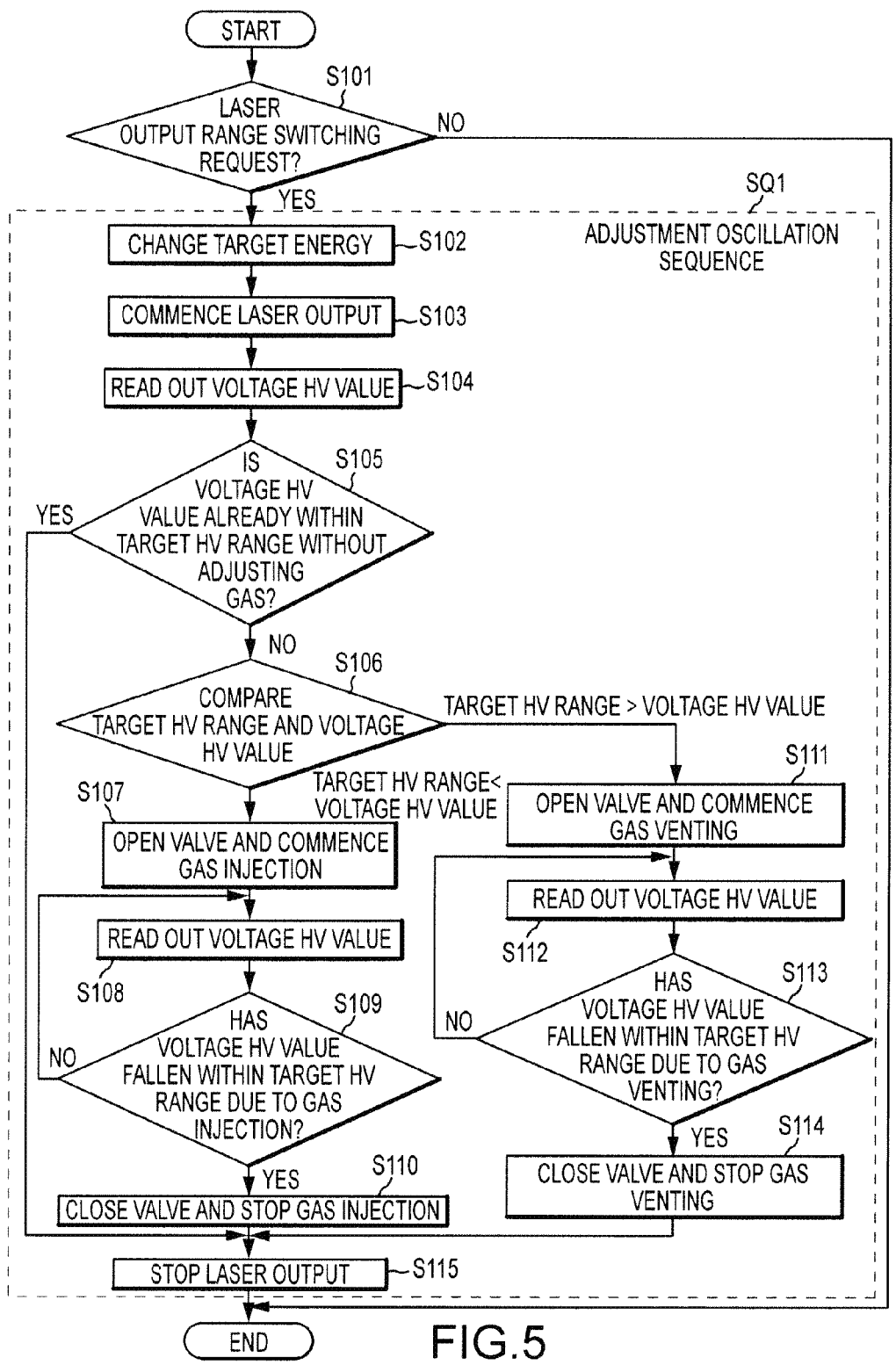
FIG. 5 is a flowchart illustrating a total gas pressure changing process sequence when target energy is changed by a laser gas control device and a laser power source control device according to the first embodiment of this disclosure.

Next, a total gas pressure changing process performed when the target energy is changed by the laser gas control device 4 and the laser power source control device 3 according to the first embodiment will be described. FIG. 5 is a flowchart illustrating a total gas pressure changing process sequence when the target energy is changed by the laser gas control device and the laser power source control device according to the first embodiment. In FIG. 5, first, the laser controller C may determine whether or not there has been a laser output range switching request resulting from the energy value command S1 from the exposure apparatus 100 (step S101). In the case where there is no laser output range switching request (step S101, No), the present process may be ended, and the output control may be continued according to the preceding state.

On the other hand, in the case where there has been a laser output range switching request (step S101, Yes), a setting for changing the target energy may be carried out (step S102), and the laser output may be commenced (step S103). After this, the current voltage HV value saved in step S1708 may be read out (step S104), and it may then be determined whether or not that voltage HV value is within a target HV range (step S105).

In the case where the value is within the target HV range (step S105, Yes), it is not necessary to adjust the gas; therefore, after the laser output has been stopped (step S115), the present process may be ended, and the output control may be continued according to the preceding state. On the other hand, in the case where the value is not within the target HV range (step S105, No), the target HV range and the voltage HV value may further be compared, and it may then be determined whether or not the target HV range is greater than the voltage HV value (step S106).

In the case where the target HV range is lower than the voltage HV value (step S106, target HV range<voltage HV value), the laser gas control device 4 may open a valve to the chamber 21 and commence the injection of the laser gas (step S107). Furthermore, the voltage HV value saved in step S1708 may be read out (step S108), and it may then be determined whether or not the voltage HV value has fallen within the target HV range as a result of the gas injection (step S109). In the case where the voltage HV value is not within the target HV range (step S109, No), the process may move to step S108, and the readout of the voltage HV value and the determination process of step S109 may be repeated. On the other hand, in the case where the voltage HV value has fallen within the target HV range (step S109, Yes), the valve may be closed and the injection of the gas may be stopped (step S110). Then, after the laser output has been stopped (step S115), the present process may be ended, and the output control may be carried out in the switched laser output range.

In the case where the target HV range is higher than the voltage HV value (step S106, target HV range>voltage HV value), the laser gas control device 4 may open the valve to the chamber 21 and commence the venting of the laser gas (step S111). Furthermore, the voltage HV value saved in step S1708 may be read out (step S112), and it may then be determined whether or not the voltage HV value has fallen within the target HV range as a result of the gas venting (step S113). In the case where the voltage HV value is not within the target HV range (step S113, No), the process may move to step S112, and the readout of the voltage HV value and the determination process of step S113 may be repeated. On the other hand, in the case where the voltage HV value has fallen within the target HV range (step S113, Yes), the valve may be closed and the venting of the gas may be stopped (step S114). Then, after the laser output has been stopped (step S115), the present process may be ended, and the output control may be carried out in the switched laser output range. Note that the processes from steps S102 through S115 correspond to an adjustment oscillation sequence SQ1.

Figure 6:
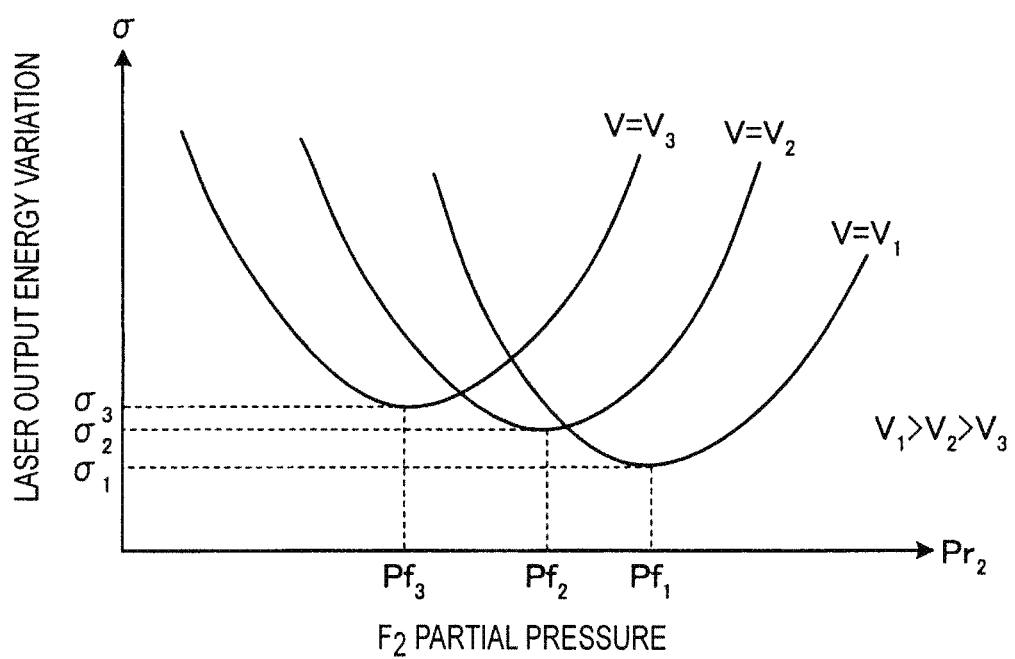
FIG. 6 illustrates dependencies of laser output energy variations on fluorine gas partial pressure, using voltage as a parameter.

Here, the target HV range in steps S105, S109, and S113 will be described. FIG. 6 illustrates a relationship among the laser output energy variation σ of an excimer laser, voltage HV values ($V_1$, $V_2$, and $V_3$), and the partial pressure of fluorine gas ($F_2$) in the laser gas. It is necessary for there to be a low energy variation (that is, a laser output energy variation) from pulse to pulse in the output light energy of an excimer laser device serving as a light source for carrying out a process such as semiconductor exposure. This is because if the variation is high, the amount of exposure light on, for example, a Si wafer will vary from chip to chip or from place to place on the surface of a single chip within the exposure apparatus, leading to a manufacturing defect in the chips. Accordingly, it is preferable to set a permissible range (specification) for the laser output energy variation σ and to control the drive of the laser device so that the voltage HV value, the total gas pressure, and the fluorine partial pressure are kept within a range that fulfills that specification.

During the driving of an excimer laser device, the output pulse energy undergoes subtle increases and decreases. Therefore, in order to suppress such increases and decreases, the control device frequently performs control that quickly carries out subtle increases and decreases in the voltage HV value. Meanwhile, as long as the control device does not forcefully supply and vent gas, there normally is no reason for the gas pressure and the fluorine gas to exhibit large fluctuations in a short amount of time. With this type of normal driving control, the fluctuation range of the voltage HV value shown in FIG. 6 is low. Therefore, it is unlikely for the variation σ to go beyond the permissible range (specification) in a short amount of time.

However, in the case where the laser output energy is considerably increased or decreased in a short amount of time, it is necessary to considerably increase or decrease the respective voltage HV values. In FIG. 6, these operations correspond to increasing the respective voltage HV values from $V_3$ to $V_1$ or decreasing the values from $V_1$ to $V_3$. Because the partial pressure of the fluorine gas is essentially constant during the short amount of time, it is highly likely that the variation σ will become significantly worse. Accordingly, in the case where the partial pressure of the fluorine gas is constant, in order to retain constant laser output energy, the variation σ is returned to the specification range by exploiting a property in which it is necessary to reduce the voltage HV value when the total gas pressure is raised and to raise the voltage HV value when the total gas pressure is reduced.

In other words, in FIG. 6, in the case where the voltage HV value is increased from $V_3$ to $V_1$ or reduced from $V_1$ to $V_3$, processes for respectively lowering or raising the total gas pressures are carried out, thus returning the respective voltage HV values from $V_1$ to the vicinity of $V_3$ or from $V_3$ to the vicinity of $V_1$. The variation σ can be returned to fall within the specification range through this process. The range within which the voltage HV value is to fall, as a result of this final process, is referred to as the target HV range.

Figure 7:
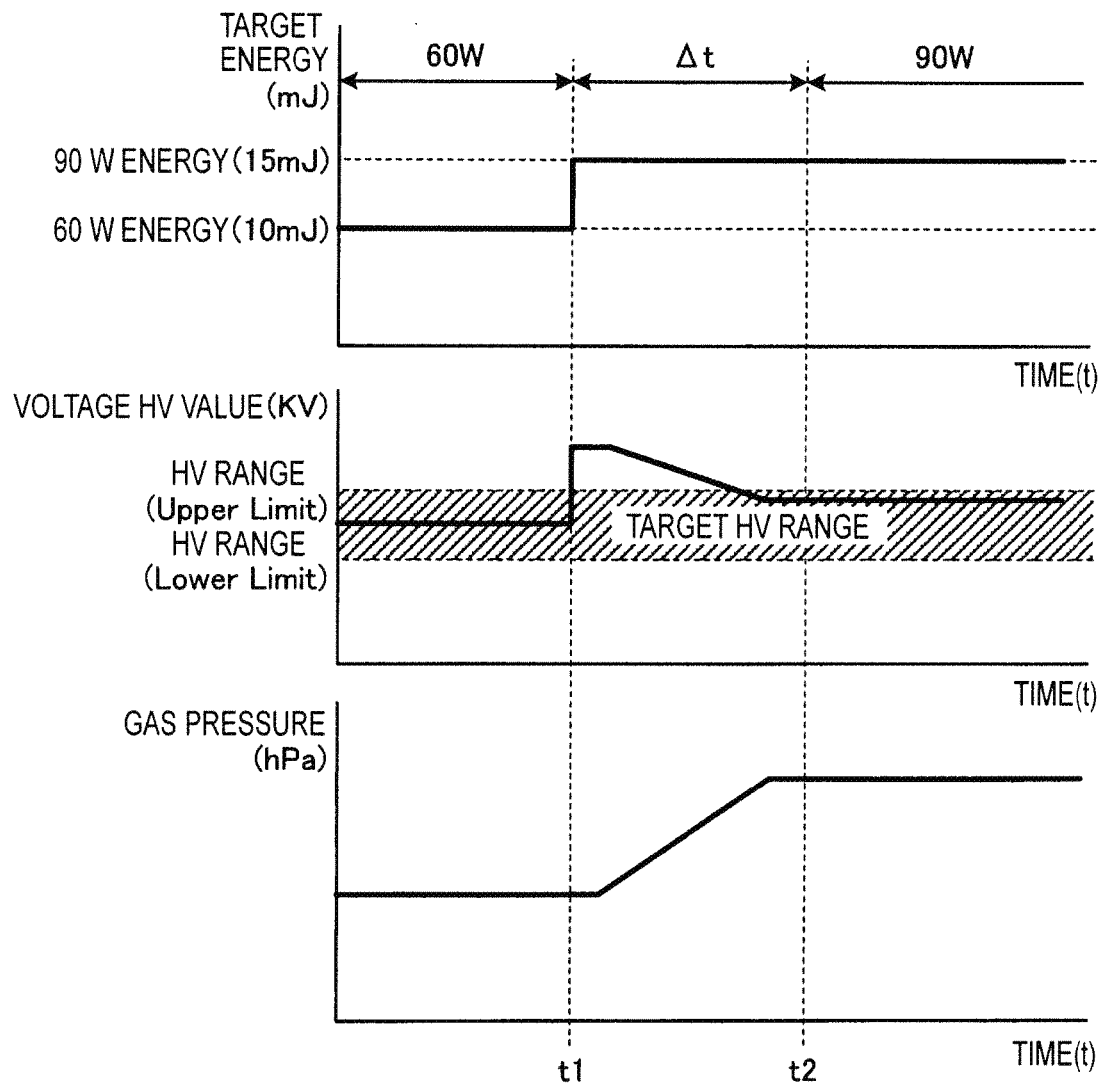
FIG. 7 is a timing chart for a change from 60 W to 90 W according to the first embodiment of this disclosure.

Here, the total gas pressure changing process carried out when changing the target energy, as illustrated in FIG. 5, will be described in detail. FIG. 7 is a timing chart for the total gas pressure changing process, when a change that raises the target energy from 60 W to 90 W has been carried out. As shown in FIG. 7, when a change request for raising the target energy from 60 W to 90 W has been received from the exposure apparatus 100, the adjustment oscillation sequence SQ1 may be carried out during the time interval from time t1 to t2 (Δt). When the target energy is changed to 90 W at time t1, the voltage HV value jumps suddenly, and is highly likely to go beyond the target HV range. After that, gas may be injected, and the gas may continue to be injected until the voltage HV value goes beyond the target HV range. The adjustment oscillation sequence SQ1 may end after the voltage HV value has gone beyond the target HV range, and the adjustment oscillation may end at time t2.

Figure 8:
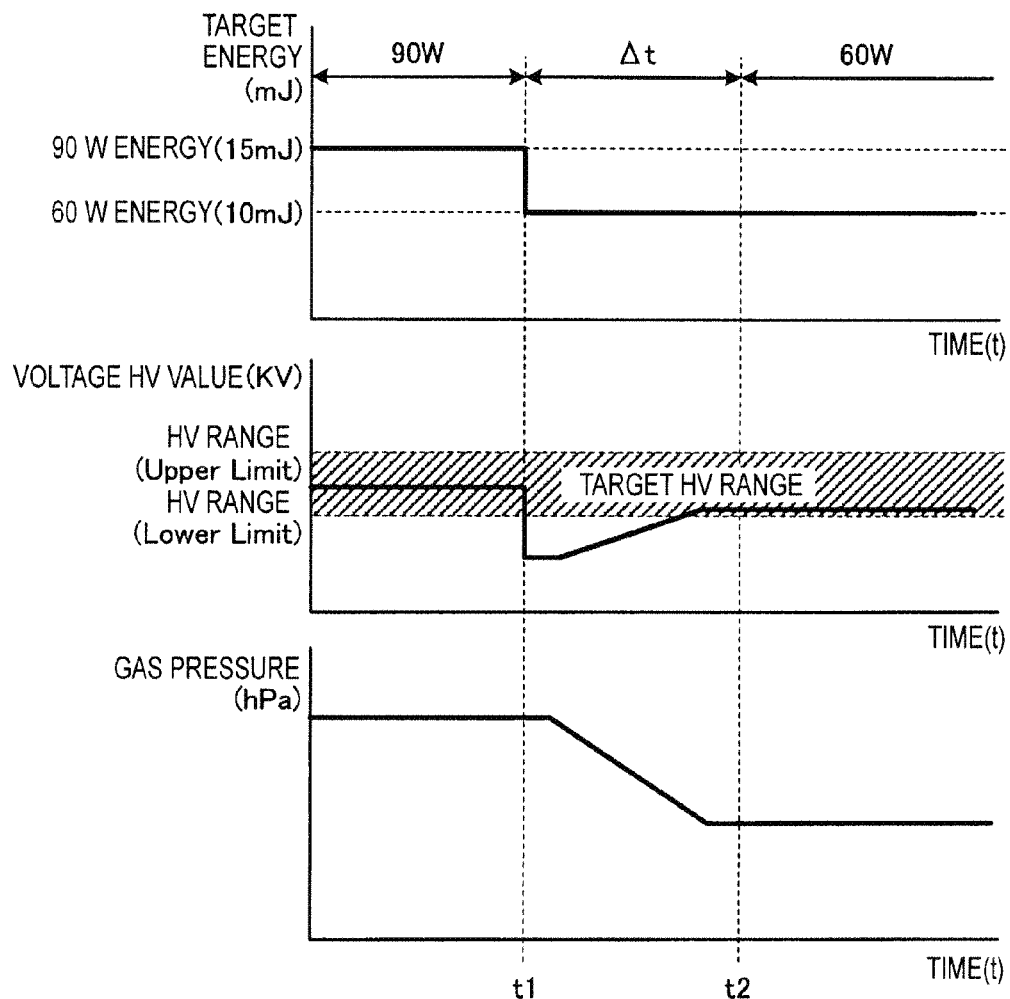
FIG. 8 is a timing chart for a change from 90 W to 60 W according to the first embodiment of this disclosure.

FIG. 8 is a timing chart for the total gas pressure changing process, when a change that lowers the target energy from 90 W to 60 W has been carried out. As shown in FIG. 8, when a change request for lowering the target energy from 90 W to 60 W has been received from the exposure apparatus 100, the adjustment oscillation sequence SQ1 may be carried out during the time interval from time t1 to t2 (Δt). When the target energy is changed to 60 W at time t1, the voltage HV value drops suddenly, and is highly likely to go beyond the target HV range. After that, gas may be vented, and the gas may continue to be vented until the voltage HV value goes beyond the target HV range. The adjustment oscillation sequence SQ1 may end after the voltage HV value has gone beyond the target HV range, and the adjustment oscillation may end at time t2.

In the first embodiment, the aforementioned adjustment oscillation sequence SQ1 is carried out; therefore, even if the target energy changes considerably, adjustment can be made to achieve a stable state in which the laser output energy variation σ is low.

First Modification on First Embodiment

A laser device for an exposure apparatus according to a first modification on the first embodiment may have the same configuration as that in the first embodiment. The first modification on the first embodiment differs from the first embodiment in terms of the control carried out when the target energy is changed. In the aforementioned first embodiment, the laser gas control device 4 and the laser power source control device 3 control the total gas pressure and the voltage HV value through the adjustment oscillation sequence SQ1. In the first modification, the total gas pressure changing process performed when the target energy is changed is carried out by the laser gas control device 4. In other words, while the total gas pressure is controlled in order to bring the voltage HV value into the target HV range in the first embodiment, in the first modification on the first embodiment, a target gas pressure is determined corresponding to the laser output range switching request, and control is carried out so that the gas pressure reaches the target gas pressure, by the laser gas control device 4 only. In the first modification on the first embodiment, control of the voltage HV value is not carried out when the target energy is changed.

Figure 9:
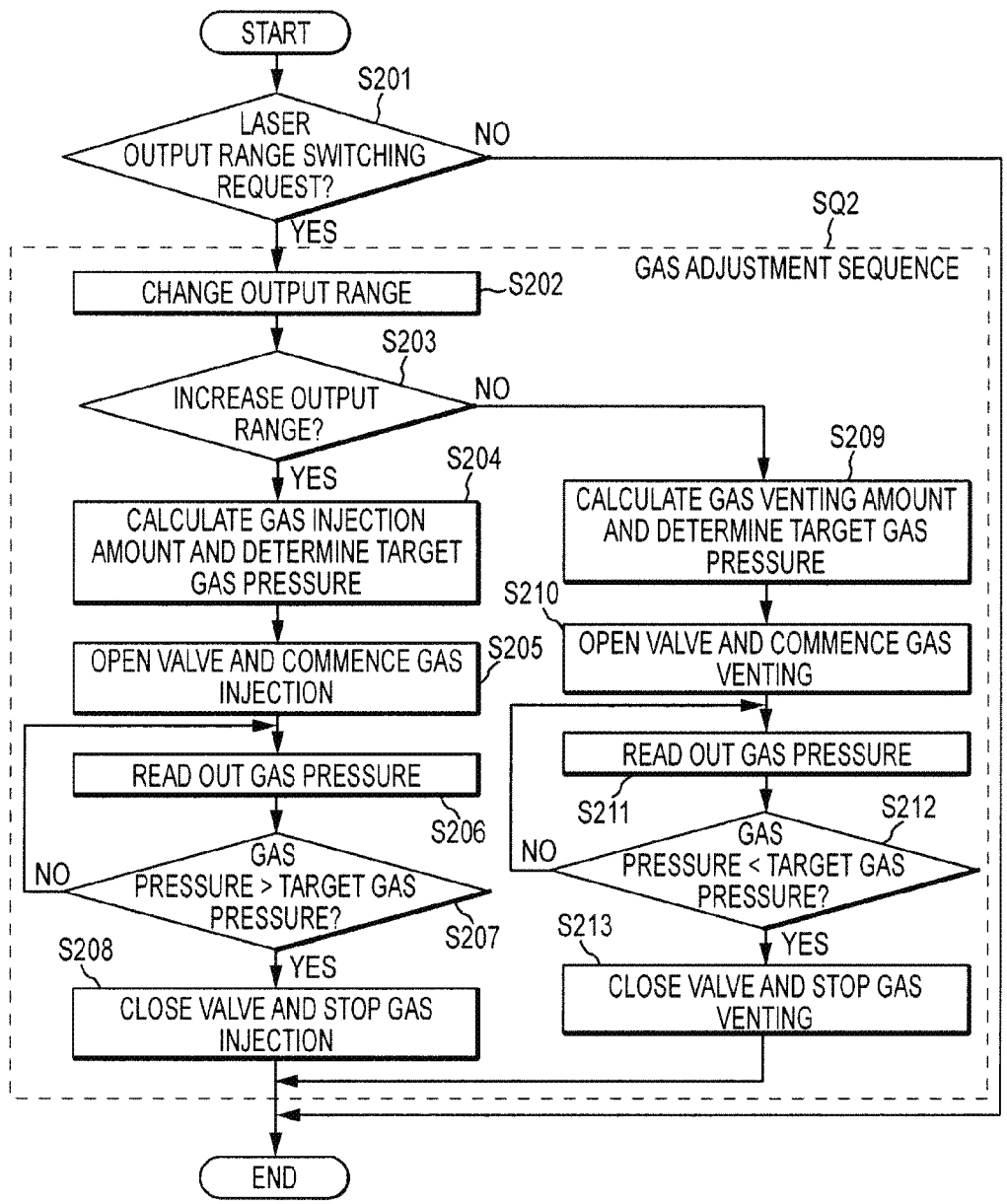
FIG. 9 is a flowchart illustrating a total gas pressure changing process sequence when target energy is changed by a laser gas control device according to a first modification on the first embodiment of this disclosure.

FIG. 9 is a flowchart illustrating a total gas pressure changing process sequence when the target energy is changed by the laser gas control device 4 according to the first modification on the first embodiment of this disclosure. As shown in FIG. 9, the laser gas control device 4 may determine whether or not a laser output range switching request has been received from the exposure apparatus 100 (step S201). In the case where there is no laser output range switching request (step S201, No), the present process may be ended, and the output control may be continued according to the preceding state.

On the other hand, in the case where there is a laser output range switching request (step S201, Yes), it may further be determined whether or not to raise the output range of the laser output (step S202). In the case where the output range is to be raised (step S203, Yes), the laser gas control device 4 may calculate the amount of gas to be injected and determine the target gas pressure (step S204). Then, the valve to the chamber 21 may be opened, and the injection of gas may be commenced (step S205). After this, the gas pressure within the chamber 21 may be measured (step S206), and it may then be determined whether or not that the gas pressure exceeds the target gas pressure (step S207). In the case where the gas pressure does not exceed the target gas pressure (step S207, No), the injection of the gas may be continued, after which the gas pressure is once again measured. This may be repeated until the gas pressure exceeds the target gas pressure. In the case where the gas pressure exceeds the target gas pressure (step S207, Yes), the valve to the chamber 21 may be closed, and the injection of the gas may be stopped (step S208). Then, the present process may be ended, and the output control may be carried out in the switched laser output range.

On the other hand, in the case where the output range is not to be raised (step S203, No), the laser gas control device 4 may calculate the amount of gas to be vented and determine the target gas pressure (step S209). Then, the valve to the chamber 21 may be opened, and the venting of the gas may be commenced (step S210). After this, the gas pressure within the chamber 21 may be measured (step S211), and it may then be determined whether or not that the gas pressure is lower than the target gas pressure (step S212). In the case where the gas pressure is not lower than the target gas pressure (step S212, No), the venting of the gas may be continued, after which the gas pressure is once again measured. This may be repeated until the gas pressure is lower than the target gas pressure. In the case where the gas pressure is lower than the target gas pressure (step S212, Yes), the valve to the chamber 21 may be closed, and the venting of the gas may be stopped (step S213). Then, the present process may be ended, and the output control may be carried out in the switched laser output range.

Note that steps S202 through S213 in FIG. 9 correspond to a gas adjustment sequence SQ2 performed by the laser gas control device 4.

Figure 10:
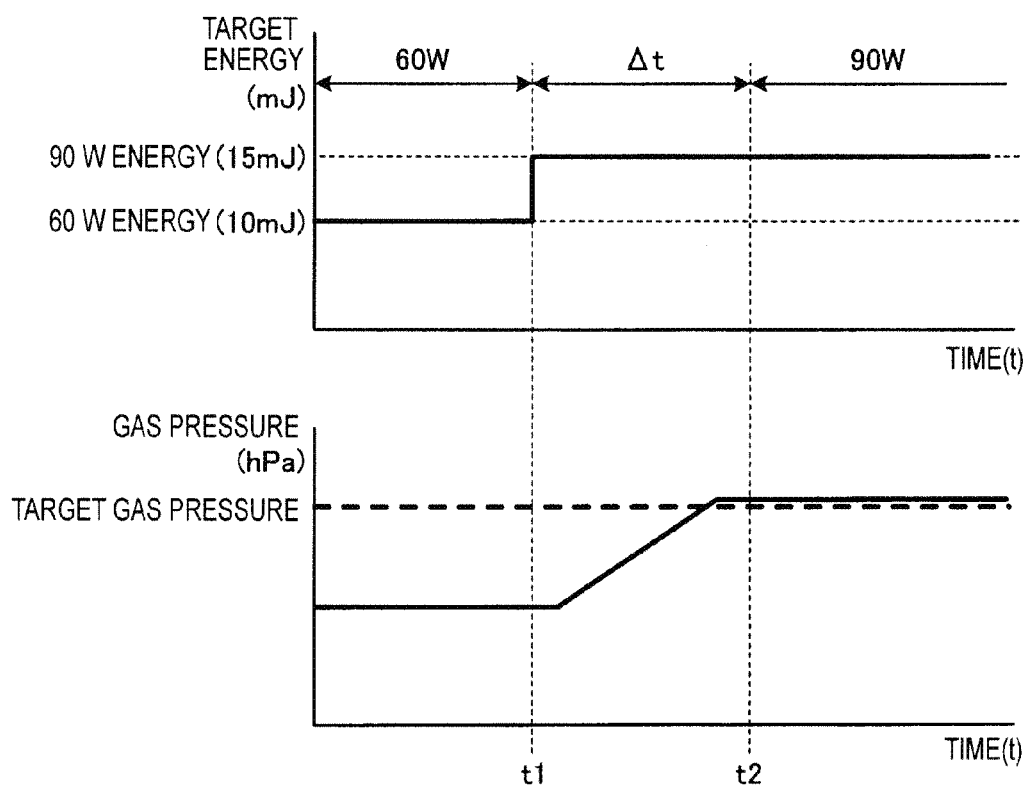
FIG. 10 is a timing chart for a change from 60 W to 90 W according to the first modification on the first embodiment of this disclosure.

Here, a total gas pressure changing process carried out only by the laser gas control device 4 when changing the target energy, as illustrated in FIG. 9, will be described in detail. FIG. 10 is a timing chart for the total gas pressure changing process, according to the first modification on the first embodiment, when a change that raises the target energy from 60 W to 90 W has been carried out. As shown in FIG. 10, when a change request for raising the target energy from 60 W to 90 W has been received from the exposure apparatus 100, the laser gas control device 4 may carry out the gas adjustment sequence SQ2 during the time interval from time t1 to t2 (Δt). When the target energy is changed to 90 W at time t1, the gas pressure gradually increases due to the gas adjustment sequence SQ2 and approaches the target gas pressure. After this, when the gas pressure has reached the target gas pressure, the gas adjustment sequence SQ2 may be ended, and the gas adjustment may be ended at time t2.

Figure 11:
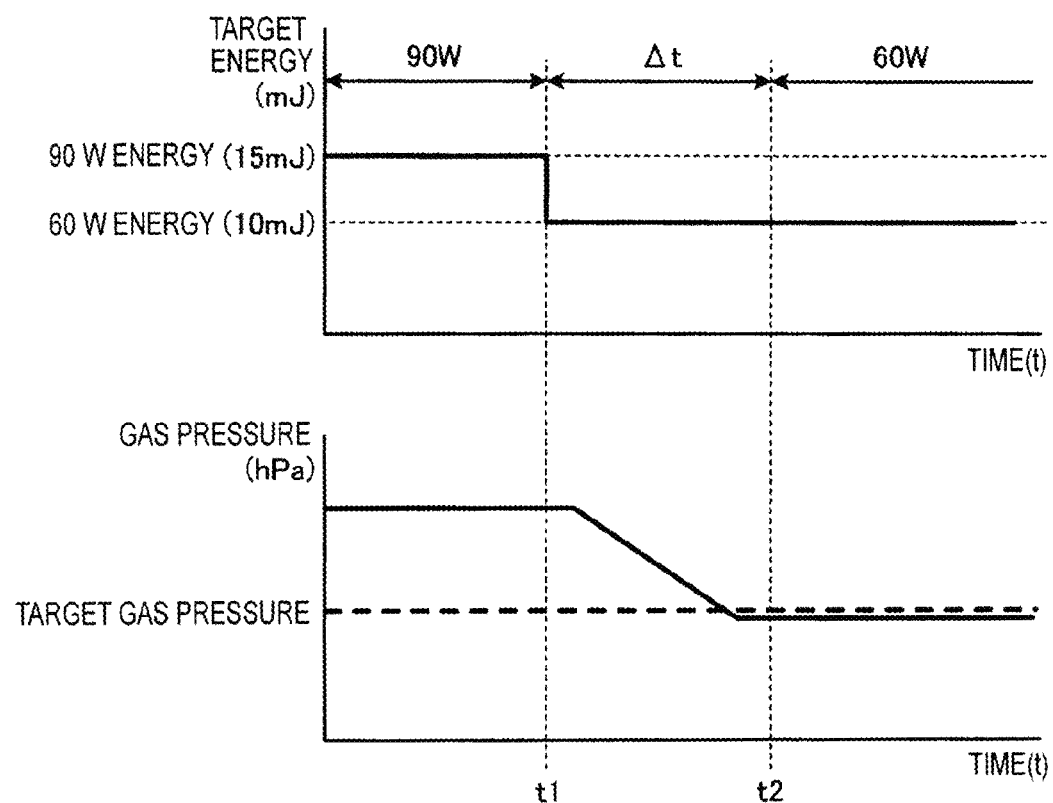
FIG. 11 is a timing chart for a change from 90 W to 60 W according to the first modification on the first embodiment of this disclosure.

On the other hand, FIG. 11 is a timing chart for the total gas pressure changing process, according to the first modification on the first embodiment, when a change that lowers the target energy from 90 W to 60 W has been carried out. As shown in FIG. 11, when a change request for lowering the target energy from 90 W to 60 W has been received from the exposure apparatus 100, the laser gas control device 4 may carry out the gas adjustment sequence SQ2 during the time interval from time t1 to t2 (Δt). When the target energy is changed to 60 W at time t1, the gas pressure gradually decreases due to the gas adjustment sequence SQ2 and approaches the target gas pressure. After this, when the gas pressure has reached the target gas pressure, the gas adjustment sequence SQ2 may be ended, and the gas adjustment may be ended at time t2.

Second Modification on First Embodiment

A laser device for an exposure apparatus according to a second modification on the first embodiment may have the same configuration as that in the first embodiment. The second modification on the first embodiment differs from the first embodiment in terms of the control carried out when the target energy is changed. In the second modification, a voltage HV value changing process is carried out by the laser power source control device 3 when the target energy is changed. In other words, while the total gas pressure is controlled so that the voltage HV value falls within the target HV range in the first embodiment, in the second modification on the first embodiment, control is carried out only by the laser power source control device 3 in order to obtain a voltage HV value that corresponds to the laser output range switching request.

Figure 12:
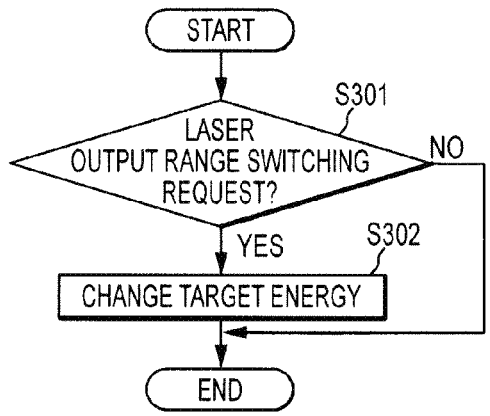
FIG. 12 is a flowchart illustrating a voltage HV value changing process sequence when target energy is changed by a laser power source control device according to a second modification on the first embodiment of this disclosure.

FIG. 12 is a flowchart illustrating a voltage HV value changing process sequence when the target energy is changed by the laser power source control device 3 according to the second modification on the first embodiment. As shown in FIG. 12, the laser power source control device 3 may determine whether or not a laser output range switching request has been received from the exposure apparatus 100 (step S301). In the case where there is no laser output range switching request (step S301, No), the present process may be ended, and the output control may be continued according to the preceding state. On the other hand, in the case where there is a laser output range switching request (step S301, Yes), the laser power source control device 3 may change the voltage HV value by changing the target energy (step S302), and the present process may then be ended.

Figure 13:
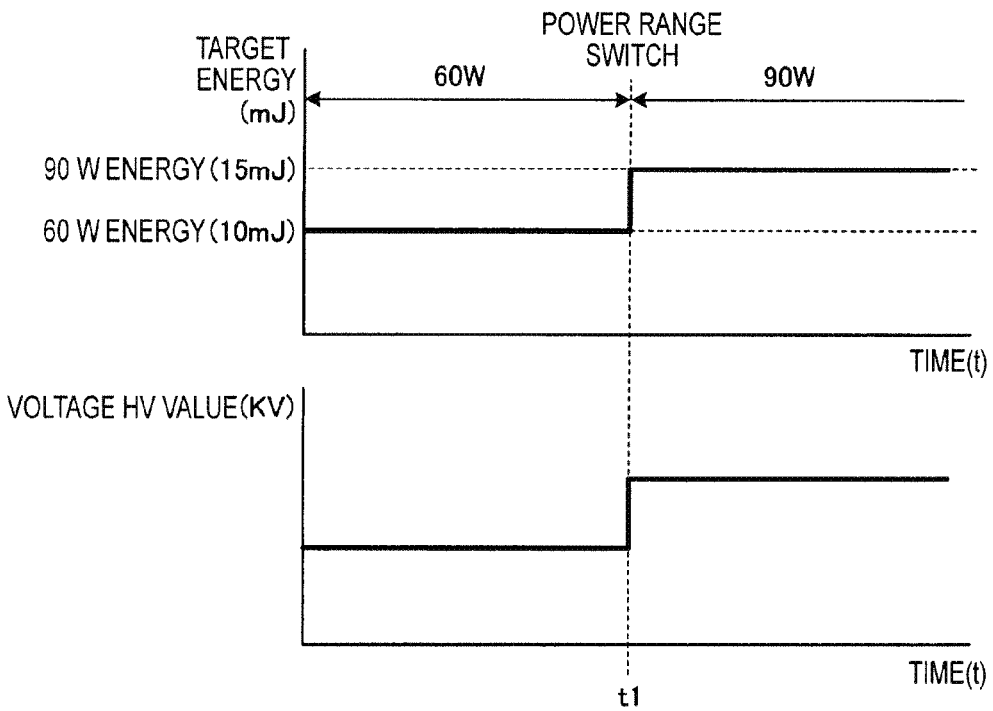
FIG. 13 is a timing chart for a change from 60 W to 90 W according to the second modification on the first embodiment of this disclosure.

Here, the voltage HV value changing process carried out by the laser power source control device 3 when changing the target energy, as illustrated in FIG. 12, will be described in detail. FIG. 13 is a timing chart for the voltage HV value changing process, according to the second modification on the first embodiment, when a change that raises the target energy from 60 W to 90 W has been carried out. As shown in FIG. 13, when a change request for raising the target energy from 60 W to 90 W has been received from the exposure apparatus 100, the laser power source control device 3 may immediately change the voltage HV value to the target HV value at time t1.

Figure 14:
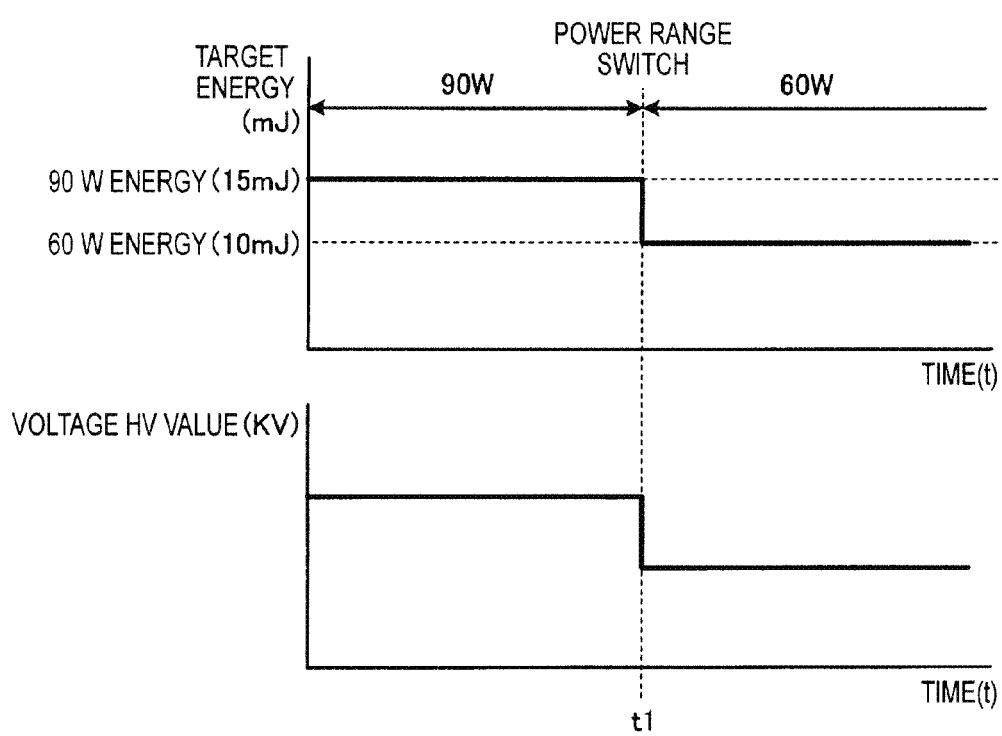
FIG. 14 is a timing chart for a change from 90 W to 60 W according to the second modification on the first embodiment of this disclosure.

On the other hand, as shown in FIG. 14, when a change request for lowering the target energy from 90 W to 60 W has been received, the laser power source control device 3 may immediately change the voltage HV value to the target HV value at time t1.

The second modification on the first embodiment has an advantage in that the target energy can be immediately changed. Accordingly, a device that has flexibility can be realized by selectively implementing the aforementioned first embodiment and the first and second modifications as appropriate in accordance with the circumstances.

Third Modification on First Embodiment

A laser device for an exposure apparatus according to a third modification on the first embodiment may have the same configuration as that in the first embodiment. In the third modification on the first embodiment, in the case where target energy is to be changed through the adjustment oscillation sequence SQ1 according to the aforementioned first embodiment, the laser gas within the chamber is replaced before the adjustment oscillation sequence SQ1.

Figure 15:
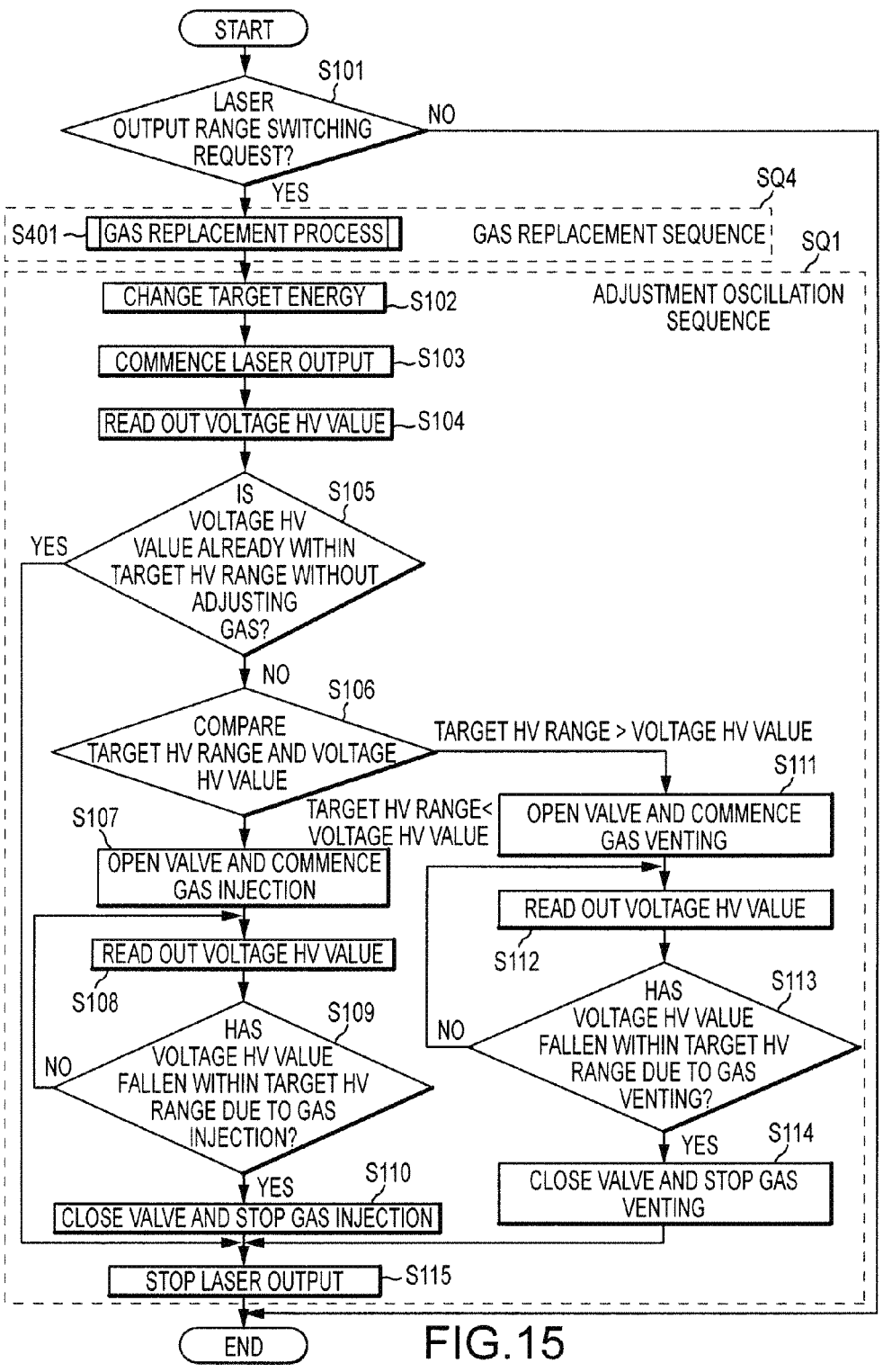
FIG. 15 is a flowchart illustrating a total gas pressure changing process sequence when target energy is changed by a laser gas control device according to a third modification on the first embodiment of this disclosure.

FIG. 15 is a flowchart illustrating a total gas pressure changing process sequence when the target energy is changed according to the third modification on the first embodiment. In this process, a gas replacement process (step S401), which is a gas replacement sequence SQ4, is carried out between step S101 and step S102 in the processing illustrated in FIG. 5.

Figure 16:
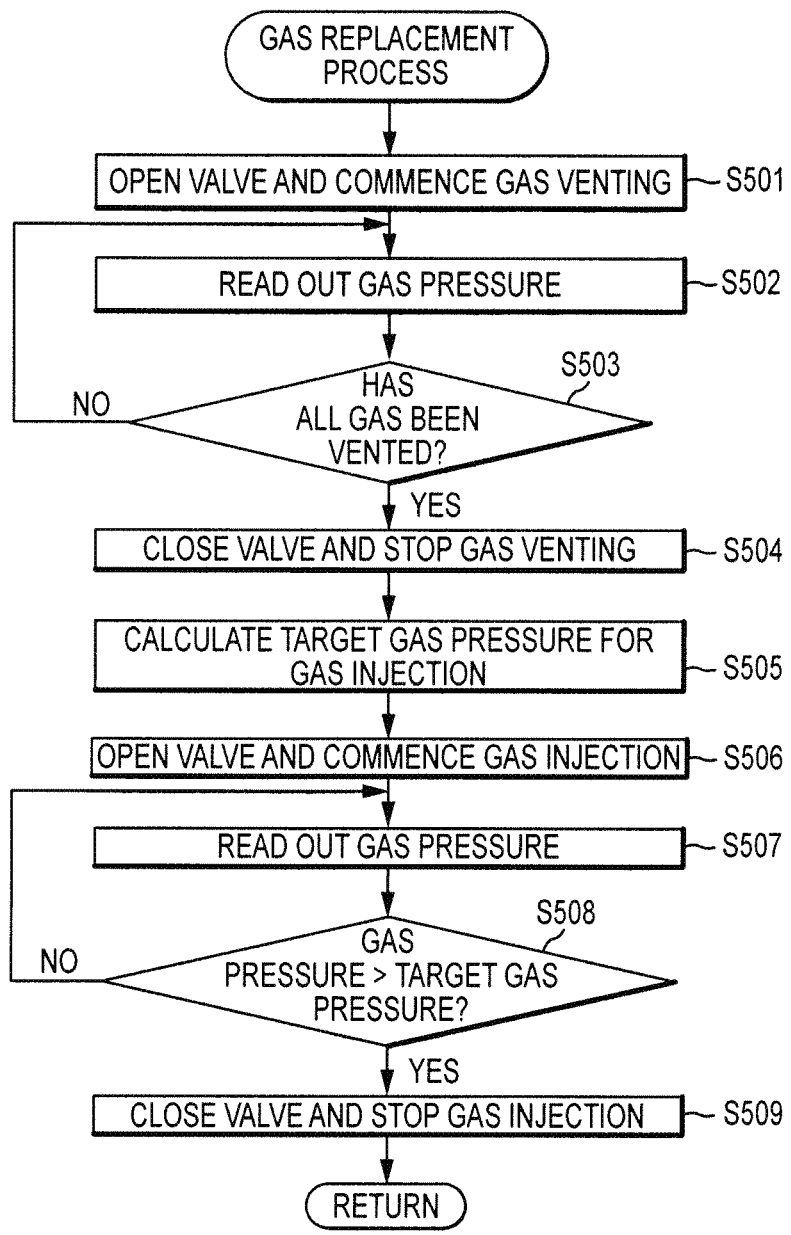
FIG. 16 is a flowchart illustrating a sequence of a gas replacement process indicated in FIG. 15.

As shown in FIG. 16, in the gas replacement process, first, the laser gas control device 4 may open the valve to the chamber 21 and commence the venting of gas (step S501). After this, the gas pressure within the chamber 21 may be measured (step S502), and it may then be determined whether or not substantially all of the gas has been vented (step S503). The device may stand by until substantially all of the gas has been vented (step S503, No), and in the case where substantially all of the gas has been vented (step S503, Yes), the valve to the chamber 21 may be closed and the venting of the gas may be stopped (step S504).

After this, the laser gas control device 4 may calculate a target gas pressure for gas injection (step S505). Then, the valve to the chamber 21 may be opened, and the injection of gas may be commenced (step S506). After this, the gas pressure within the chamber 21 may be measured (step S507), and it may then be determined whether or not that the gas pressure exceeds the target gas pressure (step S508). The device then may stand by until the gas pressure exceeds the target gas pressure (step S508, No), and in the case where the gas pressure exceeds the target gas pressure (step S508, Yes), the valve may be closed and the injection of the gas may be stopped (step S509). The process may then return to step S401, where the adjustment oscillation sequence SQ1 may be executed.

Figure 17:
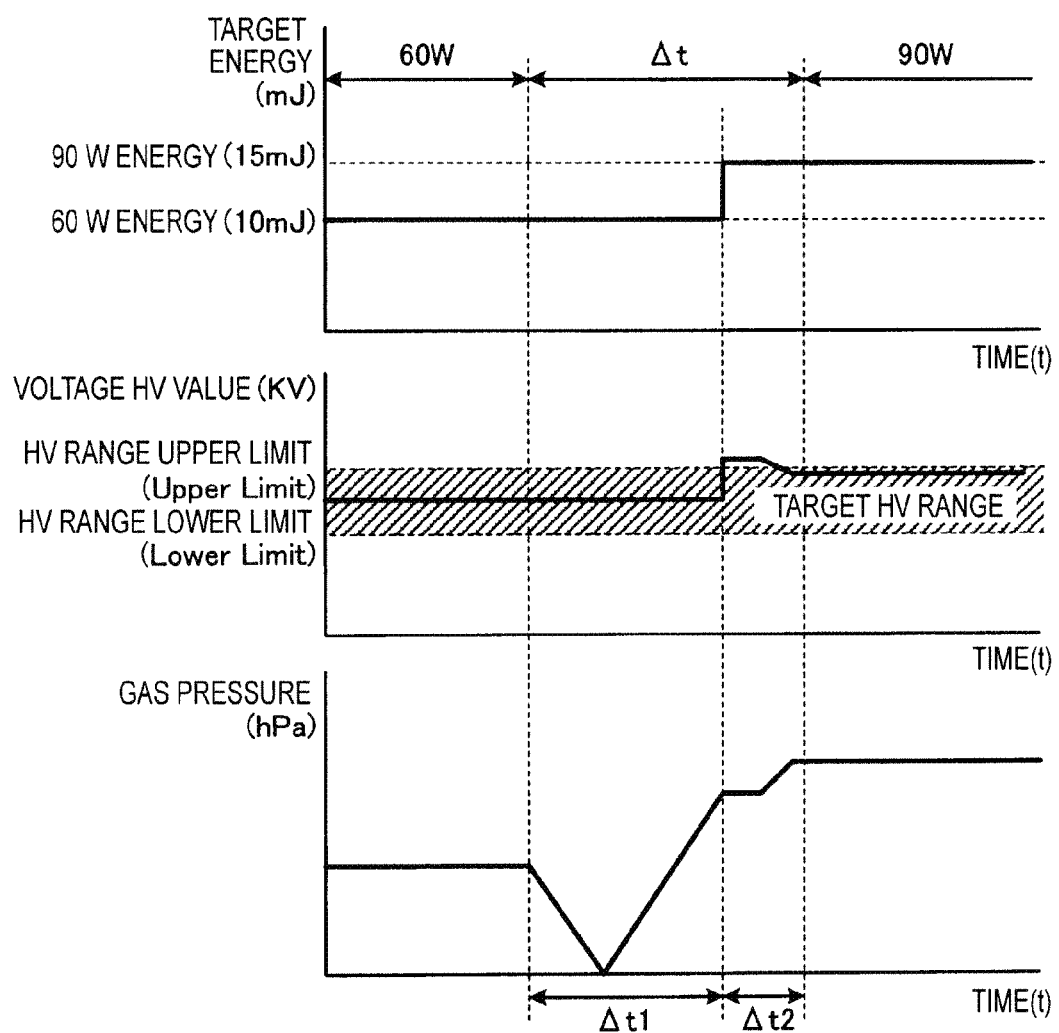
FIG. 17 is a timing chart for a change from 60 W to 90 W according to the third modification on the first embodiment of this disclosure.

For example, FIG. 17 is a timing chart for the case where the gas replacement process has been carried out when the target energy is changed from 60 W to 90 W. As shown in FIG. 17, rather than changing the target energy immediately upon receiving the target energy change request, the gas replacement process may first be carried out during the time interval Δt1. After this, during the time interval Δt2, an adjustment oscillation process may be carried out, which changes the total gas pressure so as to cause a voltage HV value to fall within the target HV range for which the change was requested. Note that during the gas replacement process, there is a point where the gas pressure within the chamber 21 reaches approximately 0. Furthermore, the gas pressure is set to be higher following the gas replacement.

Figure 18:
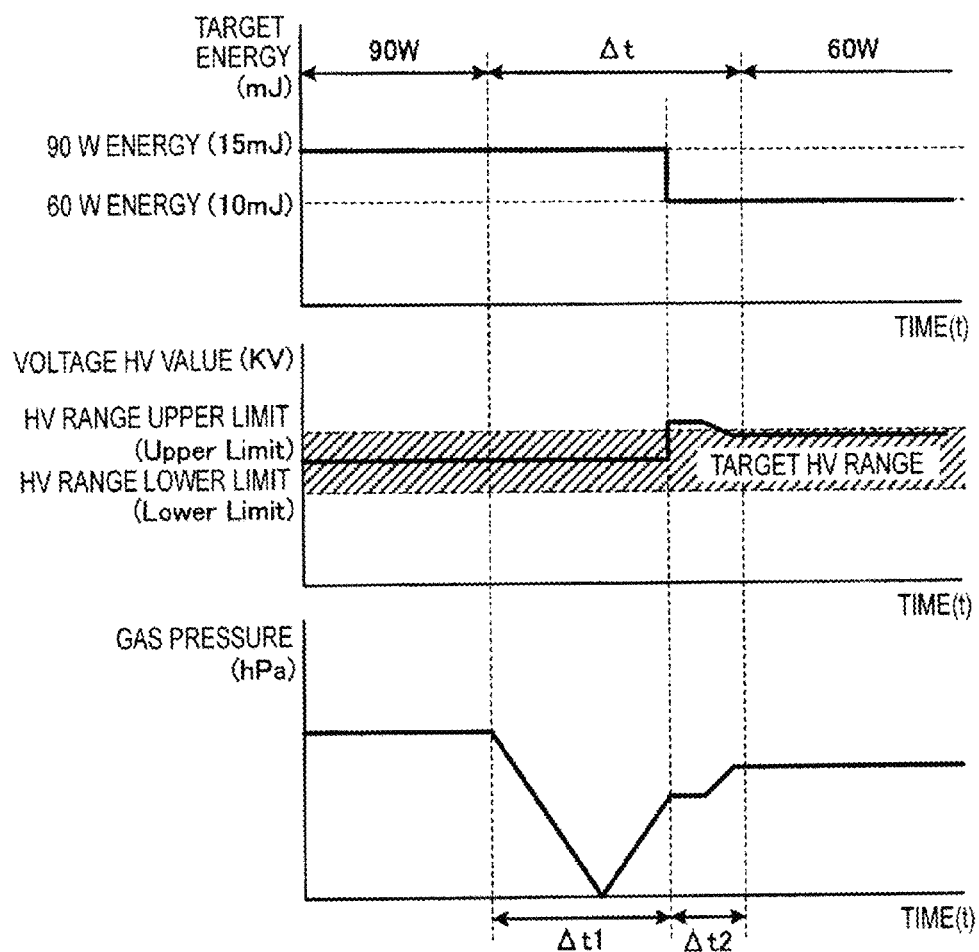
FIG. 18 is a timing chart for a change from 90 W to 60 W according to the third modification on the first embodiment of this disclosure.

Meanwhile, as shown in FIG. 18, when the target energy is changed from 90 W to 60 W, rather than changing the target energy immediately upon receiving the target energy change request, the gas replacement process may first be carried out during the time interval Δt1. After this, during the time interval Δt2, an adjustment oscillation process may be carried out, which changes the total gas pressure so as to cause a voltage HV value to fall within the requested target HV range. Note that because the target energy may be dropped thereafter, the gas pressure is set to be lower following the gas replacement.

Second Embodiment

A laser device for an exposure apparatus according to a second embodiment may have the same configuration as that in the first embodiment. In the second embodiment of this disclosure, in the case where an adjustment oscillation sequence is carried out, the shutter is opened/closed and the exposure apparatus is notified that the adjustment oscillation sequence is being carried out, in order to prevent laser light from leaking to the exposure apparatus.

Figure 19:
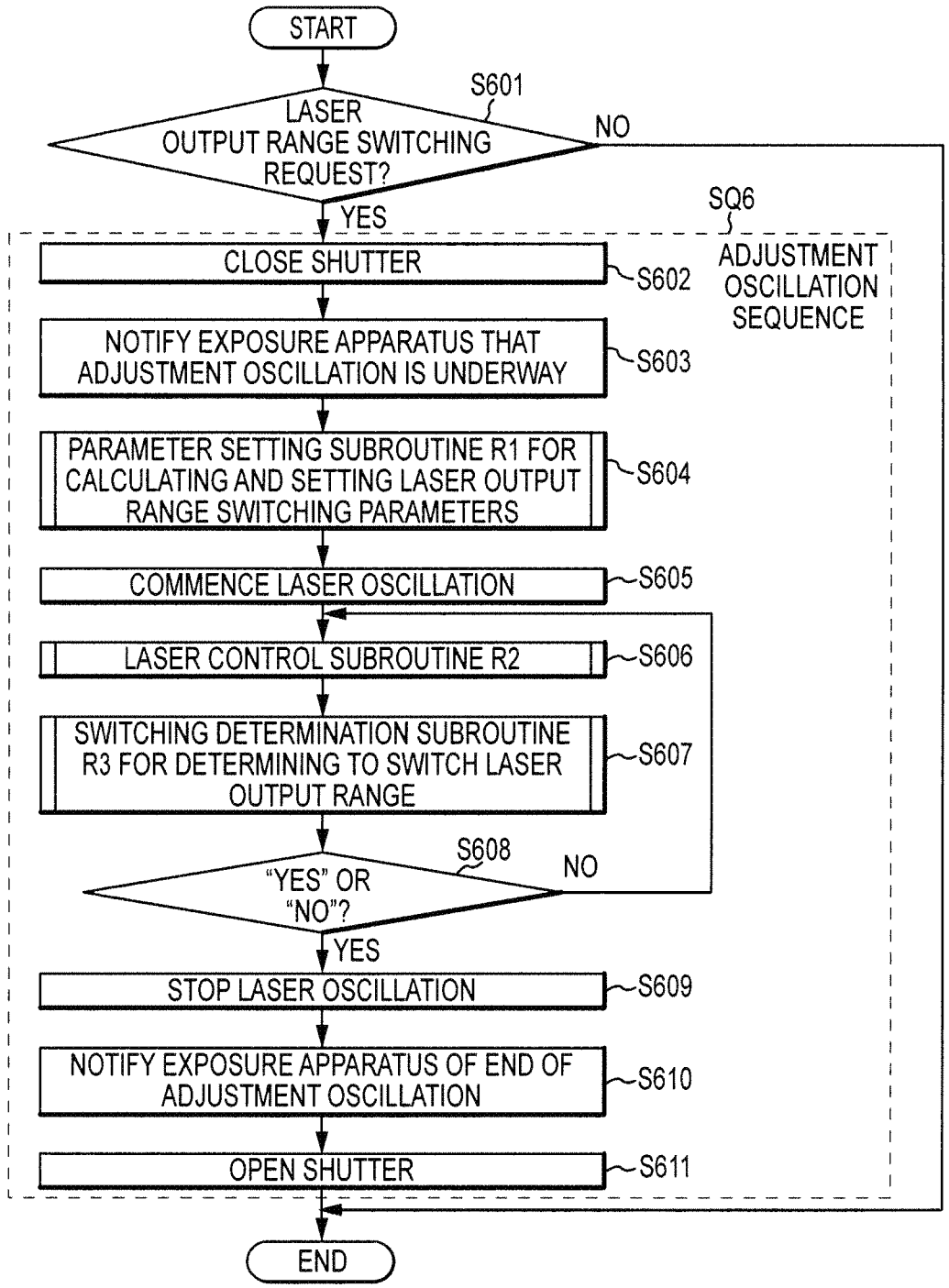
FIG. 19 is a flowchart illustrating a total gas pressure changing process sequence when target energy is changed by a laser gas control device in a laser device for an exposure apparatus according to a second embodiment of this disclosure.

FIG. 19 is a flowchart illustrating a total gas pressure changing process sequence when a target energy is changed by a laser device for an exposure apparatus according to the second embodiment of this disclosure. In FIG. 19, first, it is determined whether or not there has been a laser output range switching request (step S601), and an adjustment oscillation sequence SQ6 is carried out only in the case where there has been a laser output range switching request (step S601, Yes).

In the adjustment oscillation sequence SQ6, first, the shutter 50 may be closed (step S602), and the exposure apparatus 100 may be notified that adjustment oscillation is being carried out using, for example, an adjustment oscillation signal S2 (step S603). After this, a parameter setting subroutine R1 that calculates and sets laser output range switching parameters may be carried out (step S604). Then, the laser oscillation may be commenced (step S605), and control may be carried out so that the voltage HV value falls within the target HV range by performing a laser control subroutine R2 similar to the adjustment oscillation sequence SQ1 in the first embodiment (step S606).

Then, a switching determination subroutine R3 may be carried out to determine whether or not laser output range switching is in a state where it can be permitted (step S607). The result of this determination may be either "Yes" or "No" (step S608). In the case where the result of this determination is "No," the process may move to step S606, where the aforementioned laser control subroutine R2 and the switching determination subroutine R3 are repeatedly performed, whereas in the case where the result of this determination is "Yes," the laser oscillation may be stopped (step S609).

After this, the exposure apparatus 100 may be notified that the adjustment oscillation has ended using, for example, the adjustment oscillation signal S2 (step S610). Furthermore, the shutter 50 may be opened (step S611), and the present process may then be ended.

Figure 20:
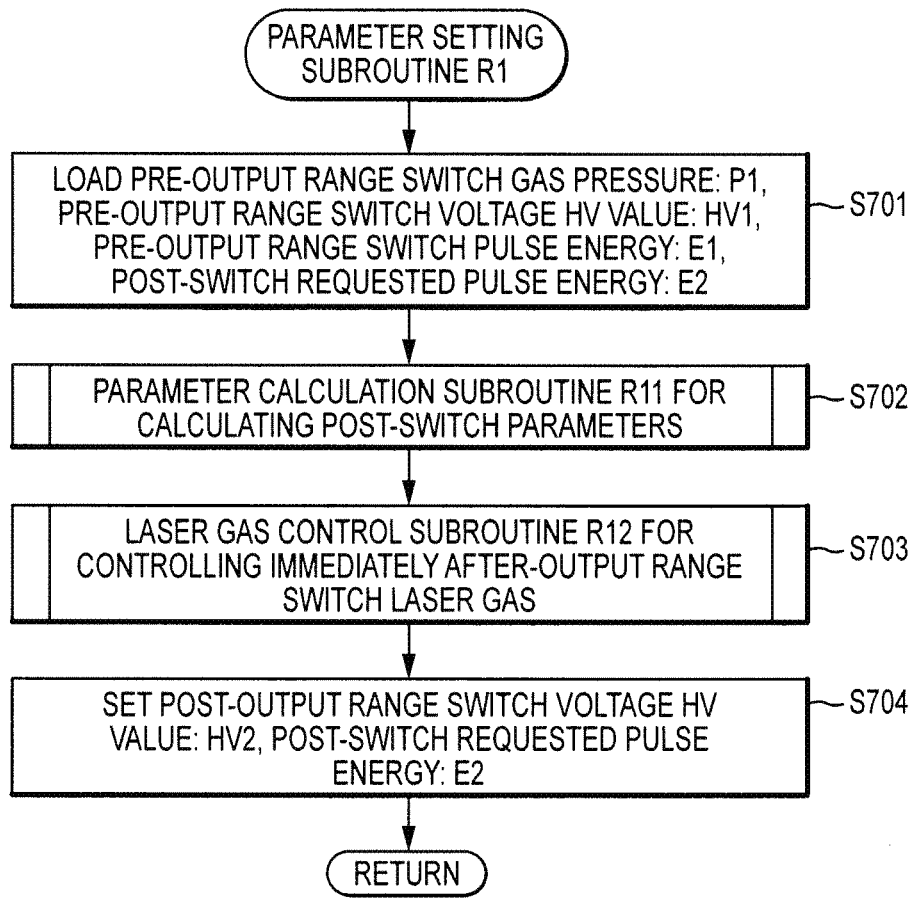
FIG. 20 is a flowchart illustrating a processing sequence of a parameter setting subroutine.

Here, the parameter setting subroutine R1 in step S604 may, as shown in FIG. 20, first, load a pre-output-range-switch gas pressure P1, a pre-output-range-switch voltage HV1, a pre-output-range-switch pulse energy E1, and a post-switch requested pulse energy E2 (step S701). Then, a parameter calculation subroutine R11 that calculates post-output-range-switch parameters may be carried out (step S702). Furthermore, a laser gas control subroutine R12 that controls the laser gas immediately after the output range switch may be carried out (step S703). Then, a post-output-range-switch voltage HV2 and the post-output-range-switch requested pulse energy E2 may be set (step S704), and the process may then return to step S604. Note that the voltage HV2 may be set based on the post-output-range-switch requested pulse energy E2 and a post-switch gas pressure P2.

Figure 21:
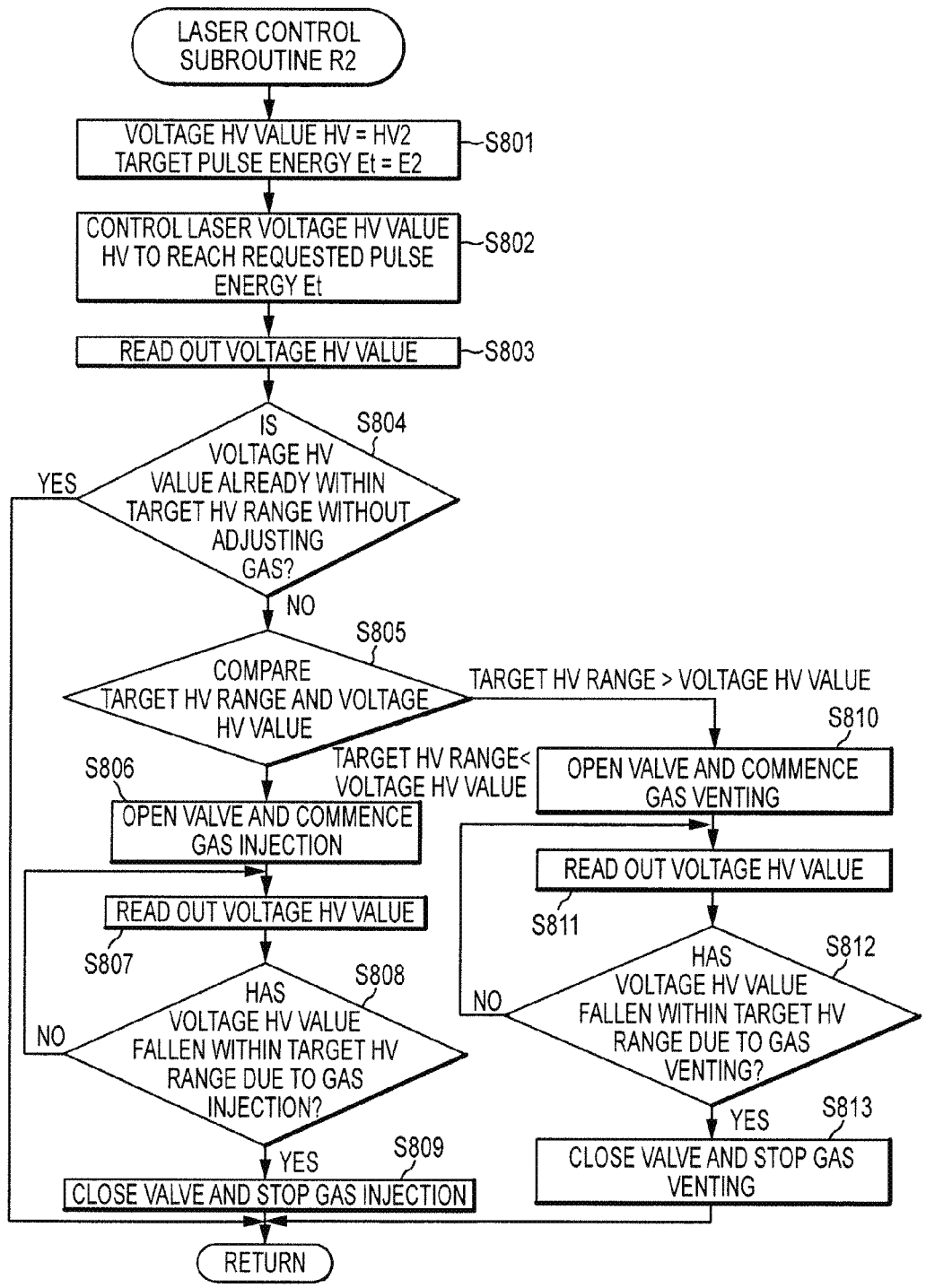
FIG. 21 is a flowchart illustrating a processing sequence of a laser control subroutine.

Furthermore, as shown in FIG. 21, the laser control subroutine R2 in step S606 may set the voltage HV value to the voltage HV2 set through the parameter setting subroutine R1, and a target pulse energy Et may then be set to the requested pulse energy E2 set through the parameter setting subroutine R1 (step S801). Then, the voltage HV value of the laser may be controlled so as to achieve the requested pulse energy Et (step S802). After this, the same processing as that of steps S104 through S114 in the adjustment oscillation sequence SQ1 shown in FIG. 5 may be carried out (steps S803 through S813), and the process may then return to step S606.

Figure 22:
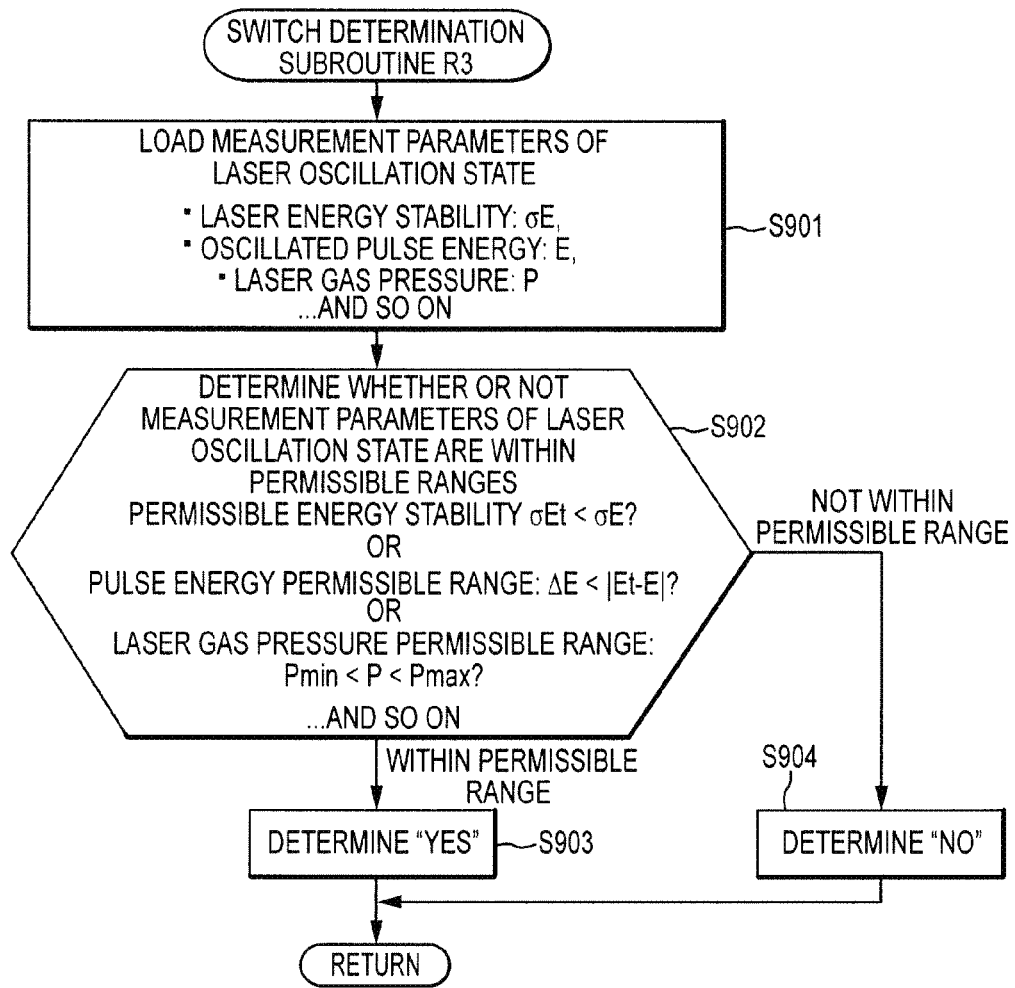
FIG. 22 is a flowchart illustrating a processing sequence of a switching determination subroutine.

Meanwhile, as shown in FIG. 22, the switching determination subroutine R3 in step S607 may first load measurement parameters of the laser oscillation state (step S901). These measurement parameters include, for example, a laser energy stability σE, an oscillated pulse energy E, a laser gas pressure P, and so on. Then, it may be determined whether or not the measurement parameters of the laser oscillation state are within permissible ranges (step S902). The details of this determination include, for example, whether the energy stability is within a permissible range (σEt<σE?), whether the pulse energy is within a permissible range (ΔE<|Et−E|?), whether the laser gas pressure is within a permissible range (Pmin<P<Pmax?), and so on. In the case where all of the measurement parameters are within the permissible ranges, a determination of "Yes" may be made (step S903), whereas in the case where at least one of the measurement parameters is not within its permissible range, a determination of "No" may be made (step S904). The process may then return to step S607.

Figure 23:
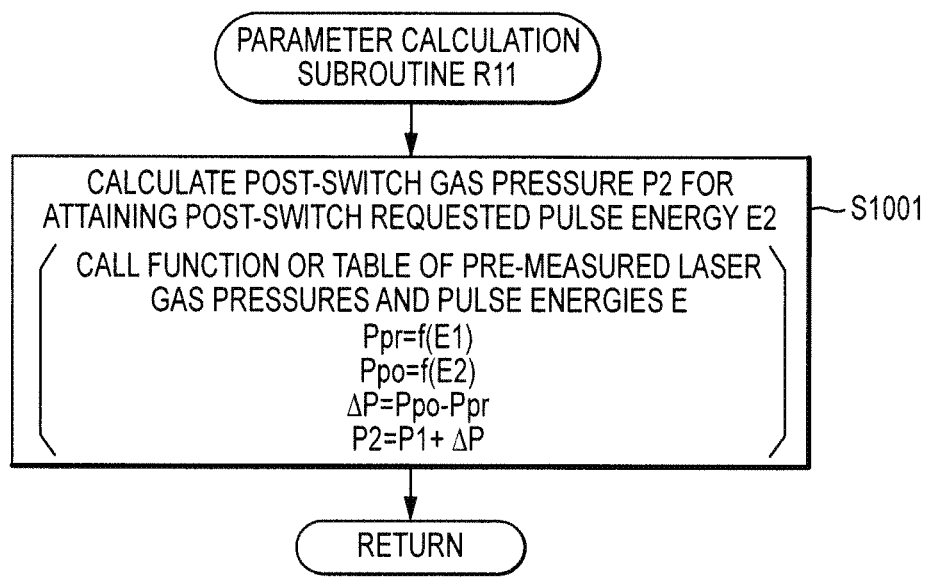
FIG. 23 is a flowchart illustrating a processing sequence of a parameter calculation subroutine.

Here, as shown in FIG. 23, the parameter calculation subroutine R11 in step S702 may calculate the post-switch gas pressure P2 for attaining the post-switch requested pulse energy E2 (step S1001), after which the process may return to step S702. Specifically, the calculation of the gas pressure P2 may be carried out by calling a function or referring to data stored in a table of pre-measured laser gas pressures and pulse energies E.

Figure 24:
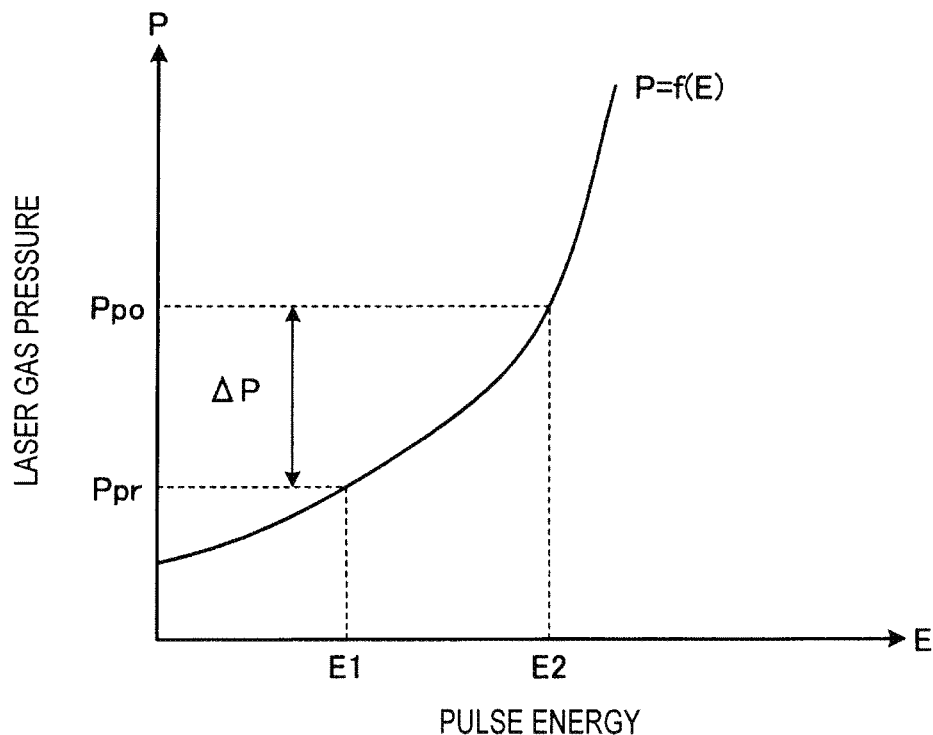
FIG. 24 illustrates a laser gas pressure dependency on pulse energy.

For example, FIG. 24 is a diagram illustrating the dependency of the laser gas pressure P on the pulse energy E, and shows a function expressed as P=f(E). Based on this function, when the pulse energy is E1 and E2, $$Ppr=f(E1)$$

$$Ppo=f(E2)$$

Based on these, a pressure difference ΔP is calculated as $$\Delta P=Ppo-Ppr$$

and the gas pressure (total pressure) P2 is calculated as $$P2=P1+\Delta P$$

Figure 25:
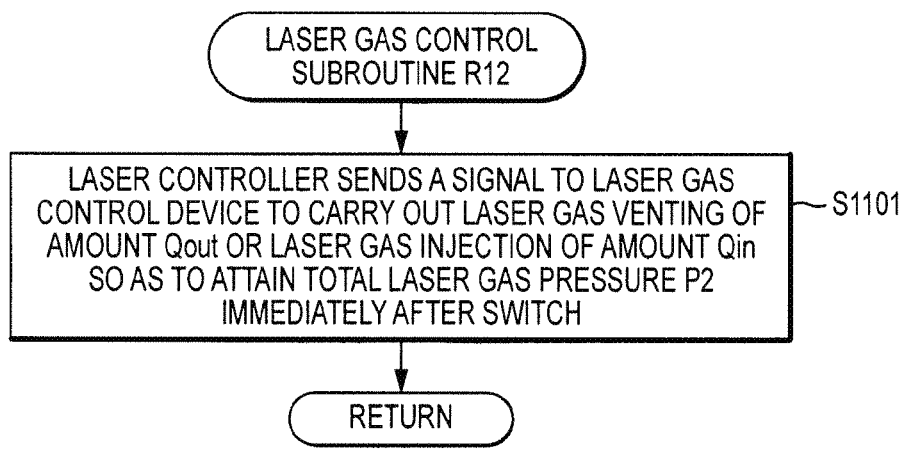
FIG. 25 is a flowchart illustrating a processing sequence of a laser gas control subroutine.

Meanwhile, as shown in FIG. 25, in the laser gas control subroutine R12 in step S703, the laser controller C may send, to the laser gas control device 4, a signal for carrying out a laser gas venting of amount Qout or a laser gas injection of amount Qin so as to attain the laser gas pressure (total pressure) P2 immediately following the switch (step S1101). The process may then return to step S703.

Modification on Second Embodiment

Figure 26:
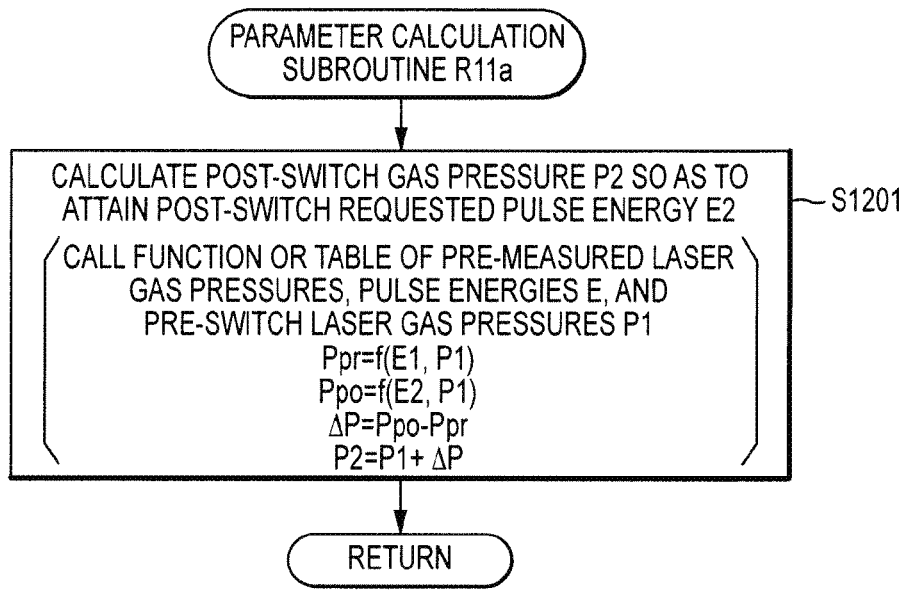
FIG. 26 is a flowchart illustrating a processing sequence of a parameter calculation subroutine.

The subroutine R11 in the aforementioned second embodiment may be replaced with a subroutine R11a. As shown in FIG. 26, the parameter calculation subroutine R11a, which corresponds to the parameter calculation subroutine R11 in step S702, may calculate the post-switch gas pressure P2 for attaining the post-switch requested pulse energy E2 (step S1201). At this time, the pre-switch laser gas pressure P1 may also be taken into consideration. Specifically, the calculation of the gas pressure P2 may be carried out by calling a function or referring to data stored in a table of pre-measured laser gas pressures, pulse energies E, and pre-switch laser gas pressures P1.

Figure 27:
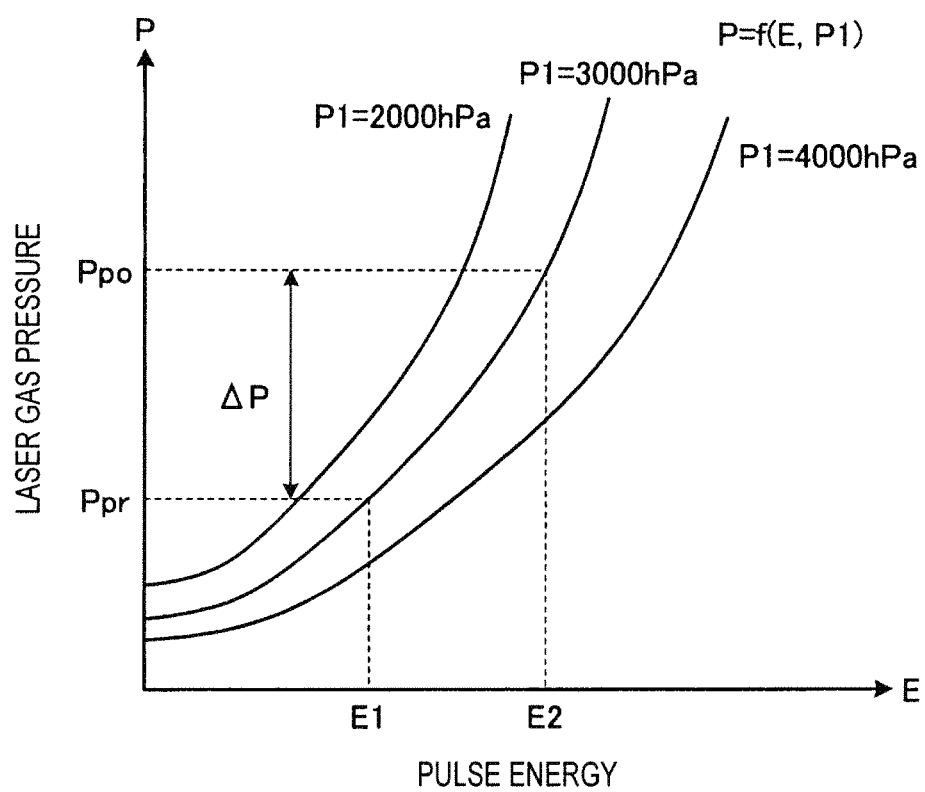
FIG. 27 illustrates a laser gas pressure dependency on pulse energy, using pre-switch laser gas pressure as a parameter.

For example, FIG. 27 is a diagram illustrating the dependency of the laser gas pressure P on the pulse energy E, using the laser gas pressure P1 prior to the switch as a parameter, and shows a function expressed as P=f (E, P1). Based on this function, when the pulse energy is E1 and E2, $$Ppr=f(E1, P1)$$

$$Ppo=f(E2, P1)$$

Based on these, a pressure difference ΔP is calculated as $$\Delta P = Ppo - Ppr$$

and the gas pressure (total pressure) P2 is calculated as $$P2 = P1 + \Delta P$$

Third Embodiment

Figure 28:
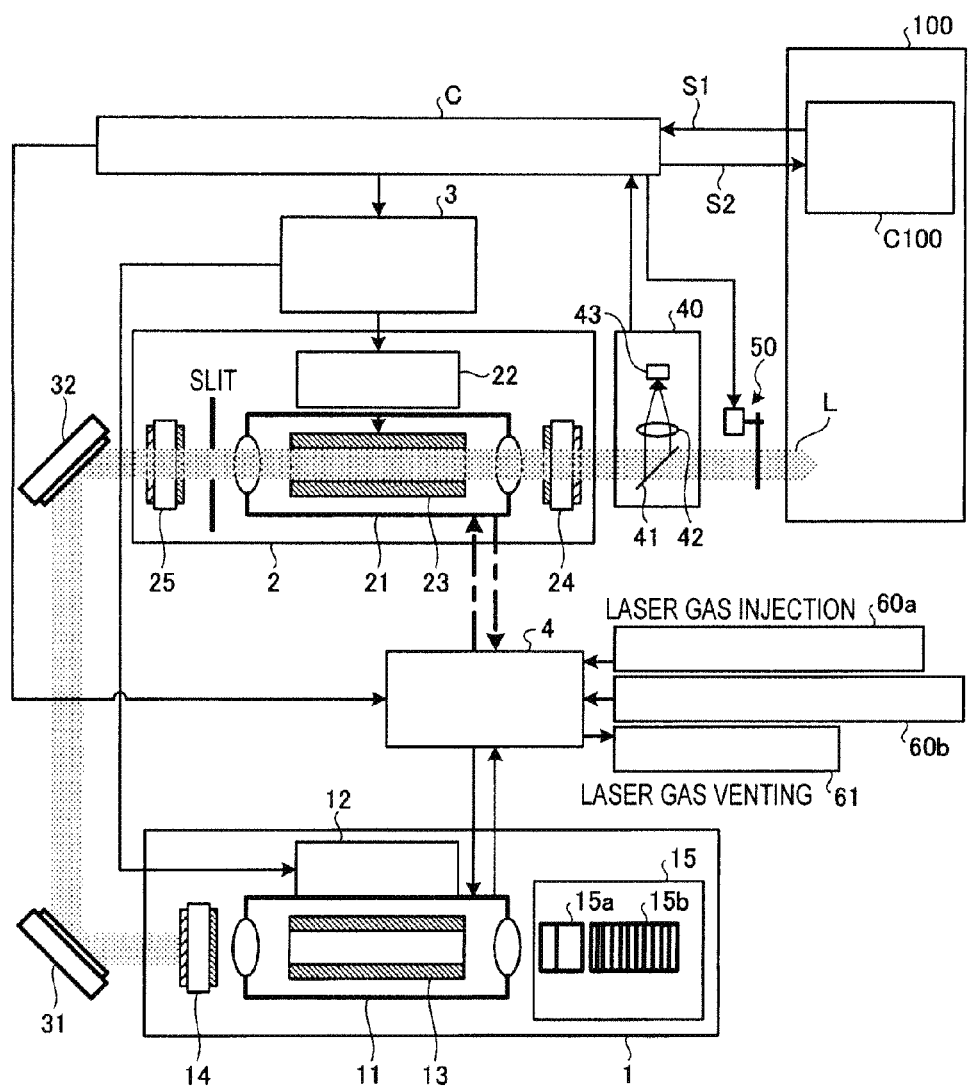
FIG. 28 schematically illustrates the configuration of a laser device for an exposure apparatus according to a third embodiment of this disclosure.

FIG. 28 schematically illustrates the configuration of a laser device for an exposure apparatus according to a third embodiment. In the third embodiment, two laser gas cylinders 60a and 60b are provided instead of the laser gas cylinder 60 according to the first embodiment, as shown in FIG. 28. The laser gas cylinder 60a holds a laser gas (Ar+Ne) that does not contain $F_2$ gas. The laser gas cylinder 60b holds a laser gas (Ar+Ne+$F_2$) that does contain $F_2$ gas. Note that the partial pressure (concentration) ratios (Ar:Ne) in the laser gas (Ar+Ne) and the laser gas (Ar+Ne+$F_2$) are set to be the same. Accordingly, by increasing/decreasing the injection amounts of the laser gas (Ar+Ne) gas and the laser gas (Ar+Ne+$F_2$), a laser gas having desired fluorine ($F_2$) gas partial pressure can be obtained with ease.

Figure 29:
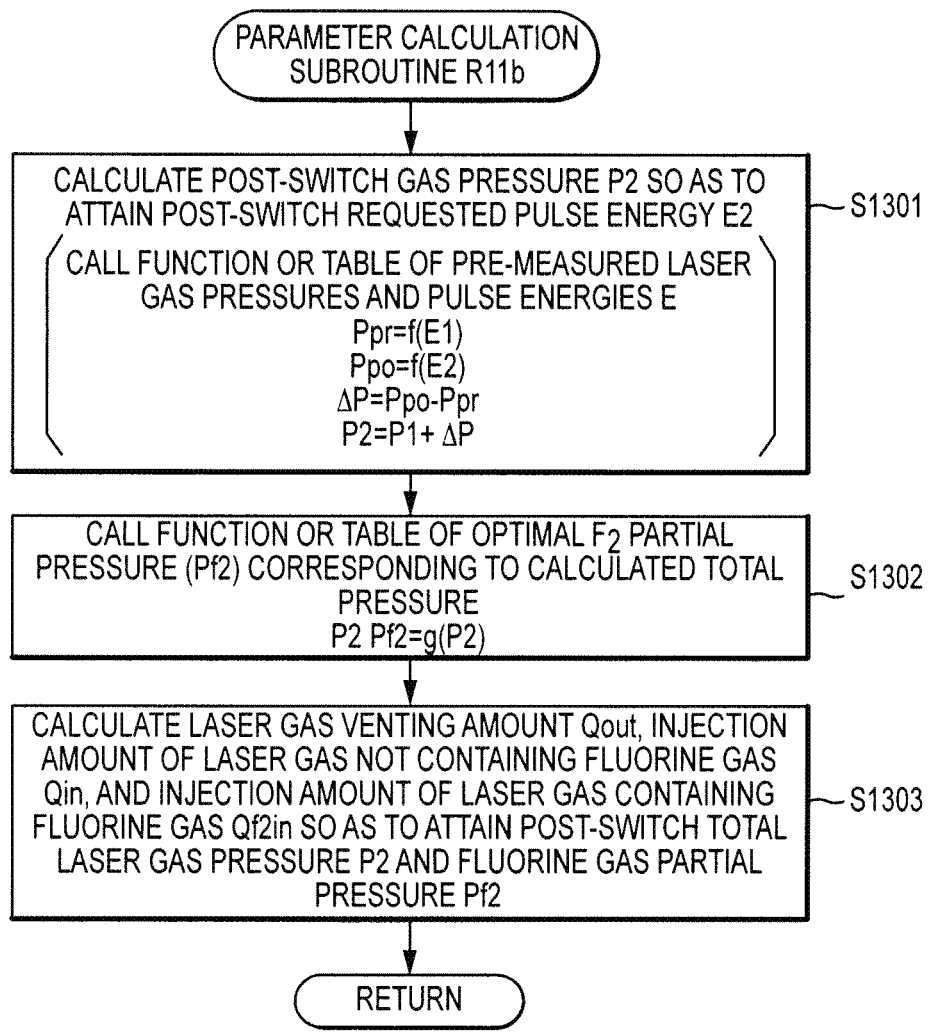
FIG. 29 is a flowchart illustrating a processing sequence of a parameter calculation subroutine.

In the third embodiment, the same type of adjustment oscillation sequence as that in the second embodiment is carried out when changing the target energy, but the parameter calculation subroutine R11 in the second embodiment may be replaced with a parameter calculation subroutine R11b shown in FIG. 29. In addition, the laser gas control subroutine R12 of the second embodiment may be replaced with a laser gas control subroutine R12a shown in FIG. 31. As shown in FIG. 29, the parameter calculation subroutine R11b, which corresponds to the parameter calculation subroutine R11 in step S702, may calculate the post-switch gas pressure P2 for attaining the post-switch requested pulse energy E2 (step S1301). Specifically, the calculation of the gas pressure P2 may be carried out by calling a function or referring to data stored in a table of pre-measured laser gas pressures and pulse energies E.

For example, assuming a function (P=f(E)) that indicates the dependency of the laser gas pressure P on the pulse energy E, when the pulse energy is E1 and E2, $$Ppr=f(E1)$$

$$Ppo=f(E2)$$

Based on these, a pressure difference ΔP is calculated as $$\Delta P = Ppo - Ppr$$

and the gas pressure (total pressure) P2 is calculated as $$P2 = P1 + \Delta P$$

Figure 30:
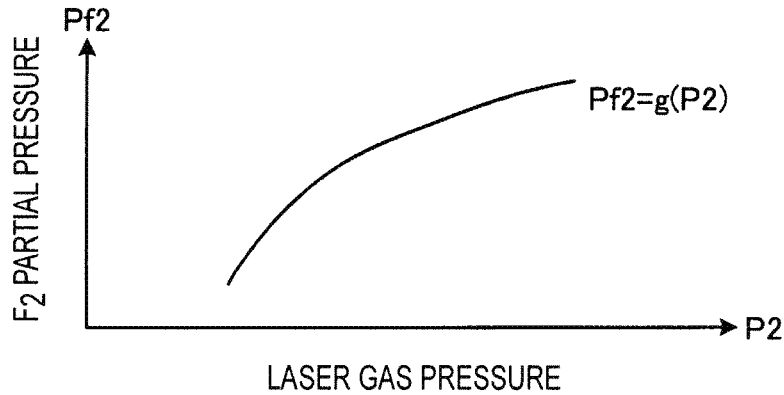
FIG. 30 illustrates a fluorine partial pressure dependency on laser gas pressure.

After this, a function (see FIG. 30) or a table of the optimal $F_2$ partial pressure (Pf2) corresponding to the calculated total pressure P2 may be called (Pf2=g(P2)) (step S1302). Furthermore, a laser gas venting amount Pout, a laser gas injection amount Qin that does not contain fluorine gas, and a laser gas injection amount Qf2in that does contain fluorine gas, which would result in the post-switch laser gas pressure P2 and fluorine gas partial pressure Pf2, may be calculated (step S1303). The process may then return to S702.

Figure 31:
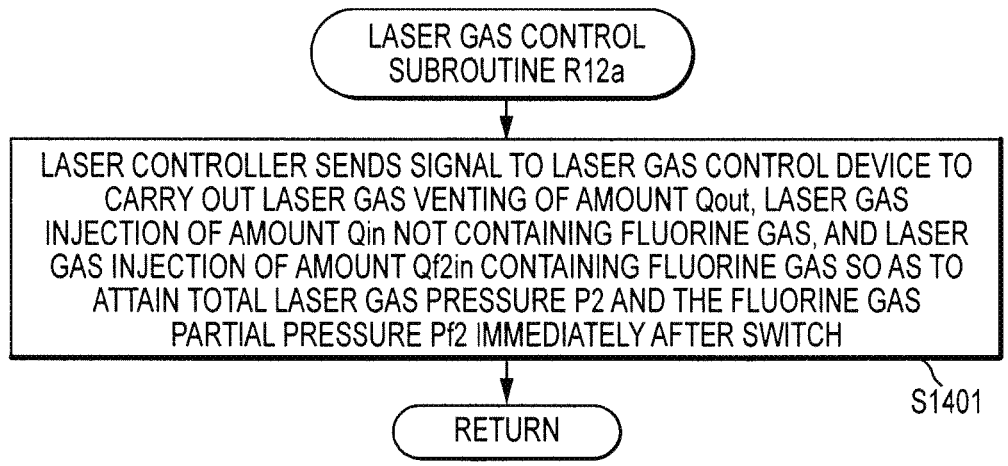
FIG. 31 is a flowchart illustrating a processing sequence of a laser gas control subroutine.

In addition, as shown in FIG. 31, in the laser gas control subroutine R12a that corresponds to the laser gas control subroutine R12 in step S703, the laser controller C may send, to the laser gas control device 4, a signal for carrying out the laser gas venting of amount Qout, the laser gas injection of amount Qin that does not contain fluorine gas, and the laser gas injection of amount Qf2in that does contain fluorine gas, so as to attain the laser gas pressure (total pressure) P2 and fluorine gas partial pressure Pf2 immediately following the switch (step S1401). The process may then return to step S703.

Modification on Third Embodiment

Figure 32:
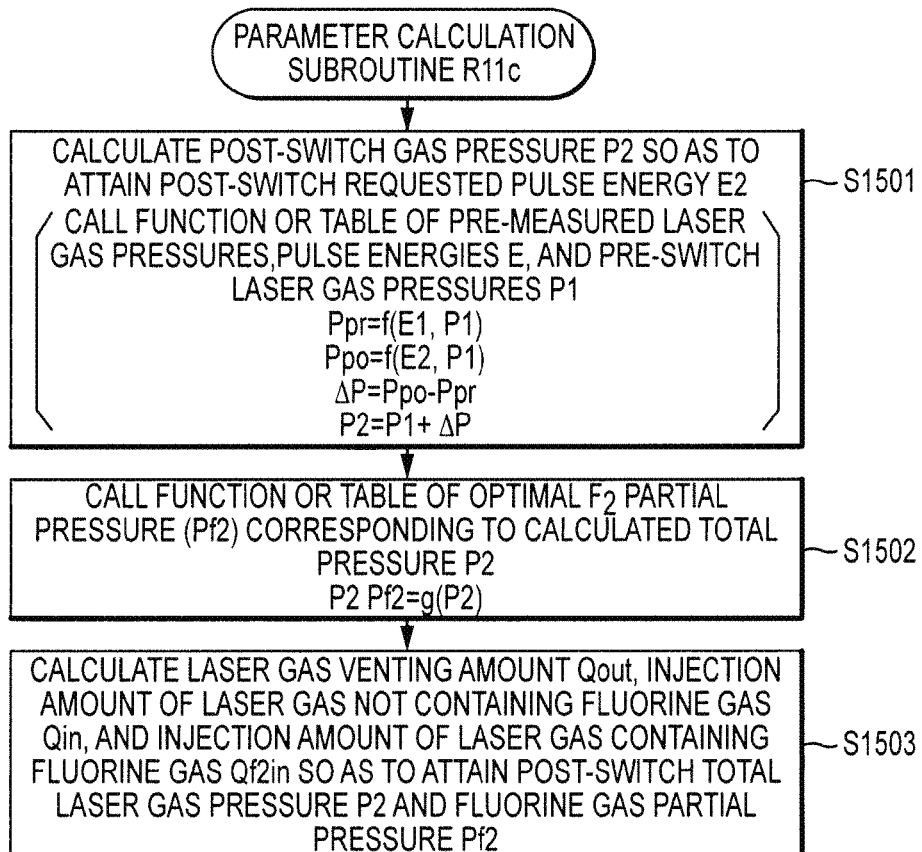
FIG. 32 is a flowchart illustrating a processing sequence of a parameter calculation subroutine.

The subroutine R11b in the aforementioned third embodiment may be replaced with a subroutine R11c. As shown in FIG. 32, the parameter calculation subroutine R11c, which corresponds to the parameter calculation subroutine R11 in step S702, calculates the post-switch gas pressure P2 for attaining the post-switch requested pulse energy E2 (step S1501); however, at this time, the pre-switch laser gas pressure P1 may also be taken into consideration. The calculation of the gas pressure P2 may be carried out by calling a function or referring to data stored in a table of pre-measured laser gas pressures, pulse energies E, and pre-switch laser gas pressures P1.

For example, FIG. 27 is a diagram illustrating the dependency of the laser gas pressure P on the pulse energy E, using the laser gas pressure P1 prior to the switch as a parameter, and shows a function expressed as P=f (E, P1). Based on this function, when the pulse energy is E1 and E2, $$Ppr=f(E1, P1)$$

$$Ppo=f(E2, P1)$$

Based on these, a pressure difference ΔP is calculated as $$\Delta P = Ppo - Ppr$$

and the gas pressure (total pressure) P2 is calculated as $$P2 = P1 + \Delta P$$

After this, a function (see FIG. 30) or a table of the optimal $F_2$ partial pressure (Pf2) corresponding to the calculated total pressure P2 may be called (Pf2=g(P2)) (step S1502). Furthermore, a laser gas venting amount Qout, a laser gas injection amount Qin that does not contain fluorine gas, and a laser gas injection amount Qf2in that does contain fluorine gas, which would result in the post-switch laser gas pressure P2 and fluorine gas partial pressure Pf2, may be calculated (step S1503). The process may then return to step S702.

Fourth Embodiment

Figure 33:
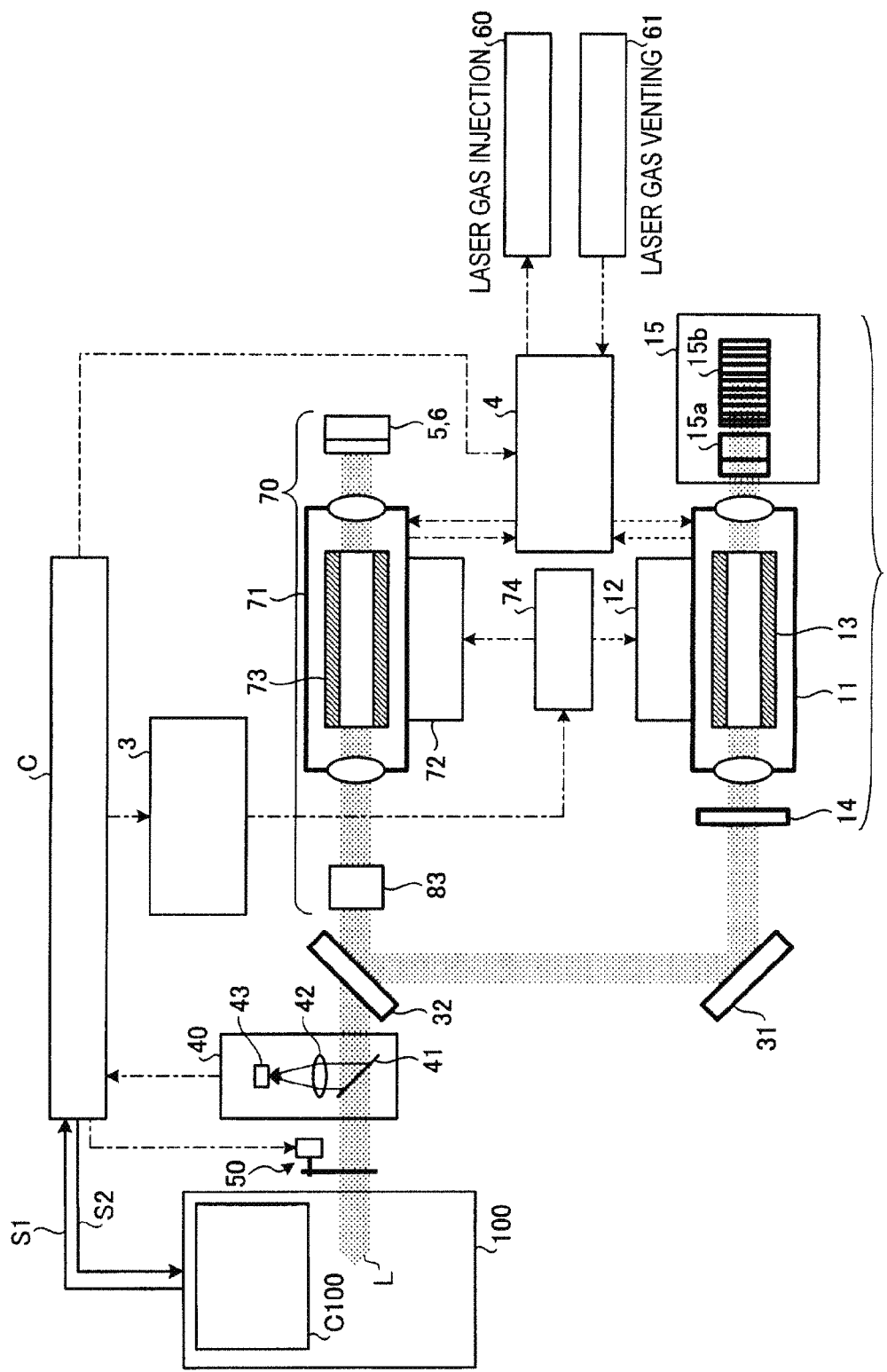
FIG. 33 schematically illustrates the configuration of a laser device for an exposure apparatus according to a fourth embodiment of this disclosure.
Figure 34:
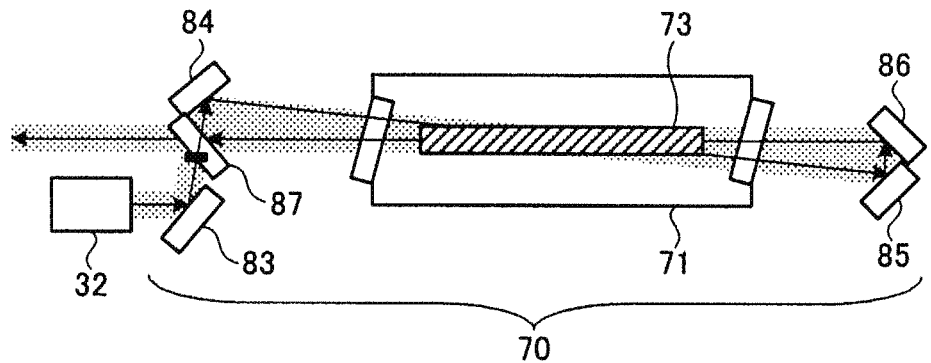
FIG. 34 illustrates the configuration of an amplifier stage shown in FIG. 33.

In a laser device for an exposure apparatus according to a fourth embodiment, the Fabry-Perot resonator used in the amplifier stage 2 of the laser device for an exposure apparatus shown in FIG. 1 is replaced with a ring resonator to constitute an amplifier stage 70. FIG. 33 is a side view schematically illustrating the configuration of the laser device for an exposure apparatus according to the fourth embodiment of this disclosure. FIG. 34 is a plan view schematically illustrating the amplifier stage 70 shown in FIG. 33.

In FIGS. 33 and 34, the light outputted from the seed laser 1 is incident on an output coupler 87 in the ring resonator via high-reflecting mirrors 31, 32, and 83. The output coupler 87 may be a partially-reflecting mirror with a reflectance of 20 to 30%. The ring resonator may include the output coupler 87 and high-reflecting mirrors 84, 85, and 86. The light outputted from the seed laser 1 is incident on the output coupler 87, is reflected by the high-reflecting mirror 84, and, via a window in a chamber 71, passes through a discharge region defined between a pair of discharge electrodes 73. A high voltage is applied between the pair of discharge electrodes 73 in synchronization with the seed laser light entering the ring resonator, resulting in a discharge.

The laser medium is excited by this discharge, and the seed laser light is amplified as a result. This amplified laser light is reflected, via the window, by the high-reflecting mirrors 85 and 86, and then once again passes, via the window, through the discharge region, and is amplified. The amplified laser light that has passed through the output coupler 87 is then outputted to the outside. Meanwhile, the light that has been reflected by the output coupler 87 is returned to the ring resonator as ring resonator feedback light, allowing the seed light to be amplified and to oscillate.

Fifth Embodiment

Figure 35:
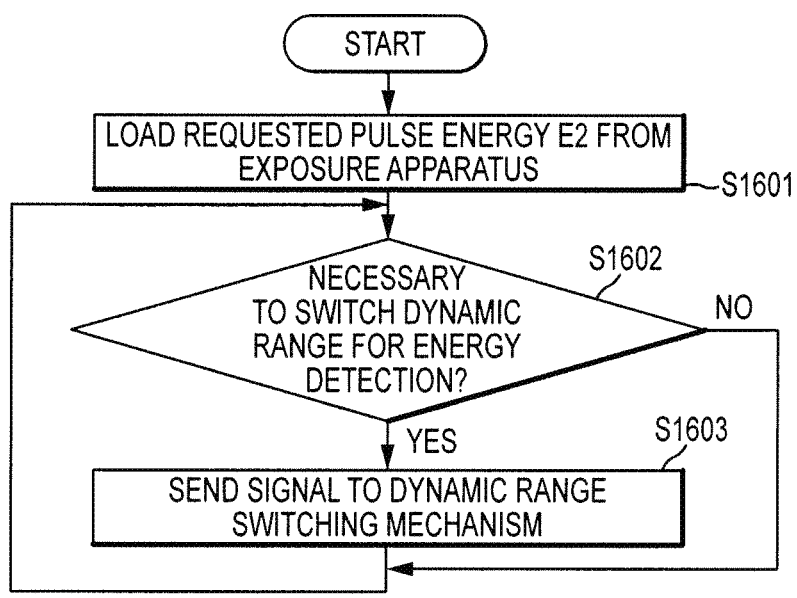
FIG. 35 is a flowchart illustrating a control processing sequence performed by a laser controller on a dynamic range switching mechanism.

A laser device for an exposure apparatus according to a fifth embodiment is provided with a dynamic range switching mechanism, which switches the dynamic range of energy detection, in the energy sensor unit 40 shown in FIG. 1. Other configurations in the laser device for an exposure apparatus according to the fifth embodiment may be the same as those in the laser device for an exposure apparatus according to the first embodiment as illustrated in FIG. 1. As shown in FIG. 35, the laser controller C may load the post-switch requested pulse energy E2 from the exposure apparatus 100 (step S1601), and may then determine whether or not it is necessary to switch the dynamic range of energy detection based on the post-switch requested pulse energy E2 (step S1602). In the case where it has been determined that it is necessary to switch the dynamic range of energy detection (step S1602, Yes), a signal for driving the dynamic range switching mechanism may be sent to the dynamic range switching mechanism (step S1603), after which the process may return to step S1601. However, in the case where it has been determined that it is not necessary to switch the dynamic range of energy detection (step S1602, No), the process may return directly to step S1601.

Figure 36:
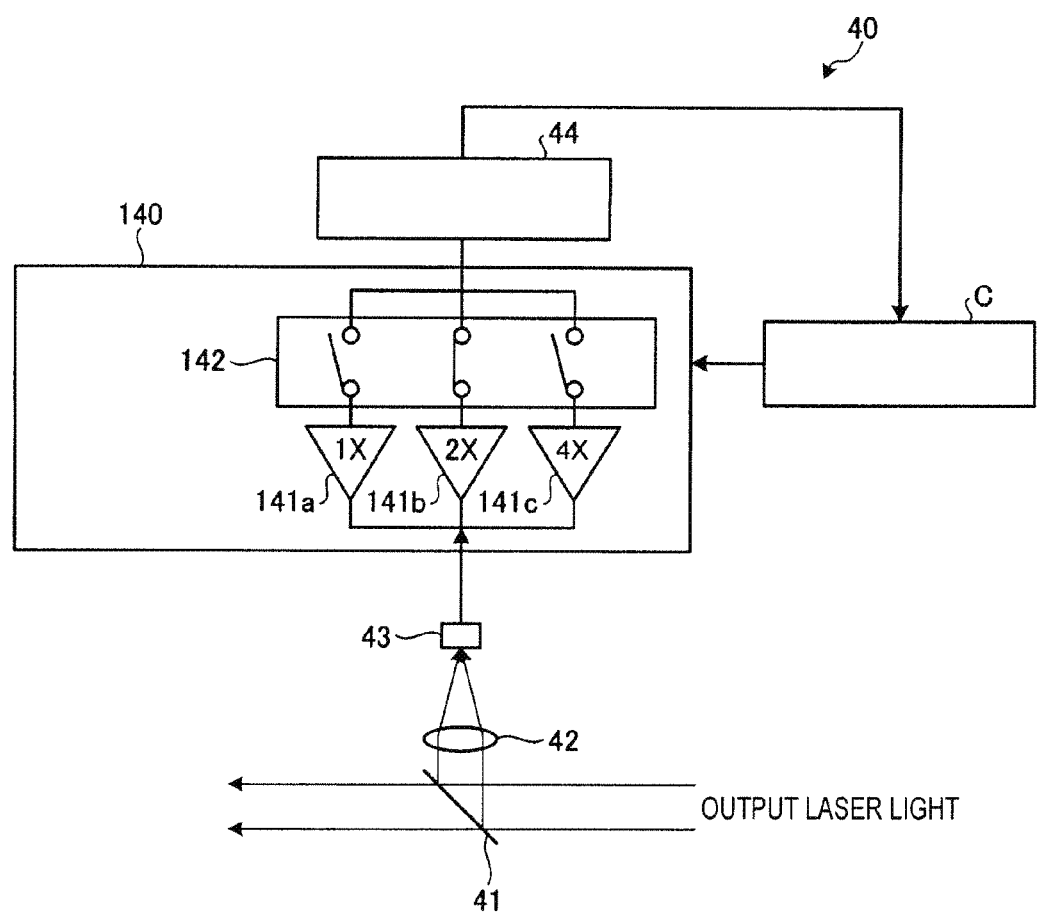
FIG. 36 schematically illustrates the configuration of a dynamic range switching mechanism in a laser device for an exposure apparatus according to a fifth embodiment of this disclosure.

FIG. 36 is a schematic diagram illustrating an example of an energy sensor unit that includes a dynamic range switching mechanism. As shown in FIG. 36, a dynamic range switching mechanism 140 may include three amplifiers 141a through 141c, each of which has a different amplification rate, and a multiplexer 142 that selects and outputs signals outputted from the amplifiers 141a to 141c. The amplification rates of the amplifiers 141a through 141c may be 1×, 2×, and 4×, respectively. A detection signal outputted from the optical sensor 43, which is a photodiode or the like, may be inputted into the branched amplifiers 141a through 141c, amplified at the respective amplification rates, selected and outputted by the multiplexer 142, and outputted to an AD converter 44. The AD converter 44 may output the inputted detection signal to the laser controller C as a digital signal. Then, as described earlier, the laser controller C may send a switching signal to the multiplexer 142 in order to obtain a dynamic range of energy detection that corresponds to the post-switch requested pulse energy E2.

Modification on Fifth Embodiment

Figure 37:
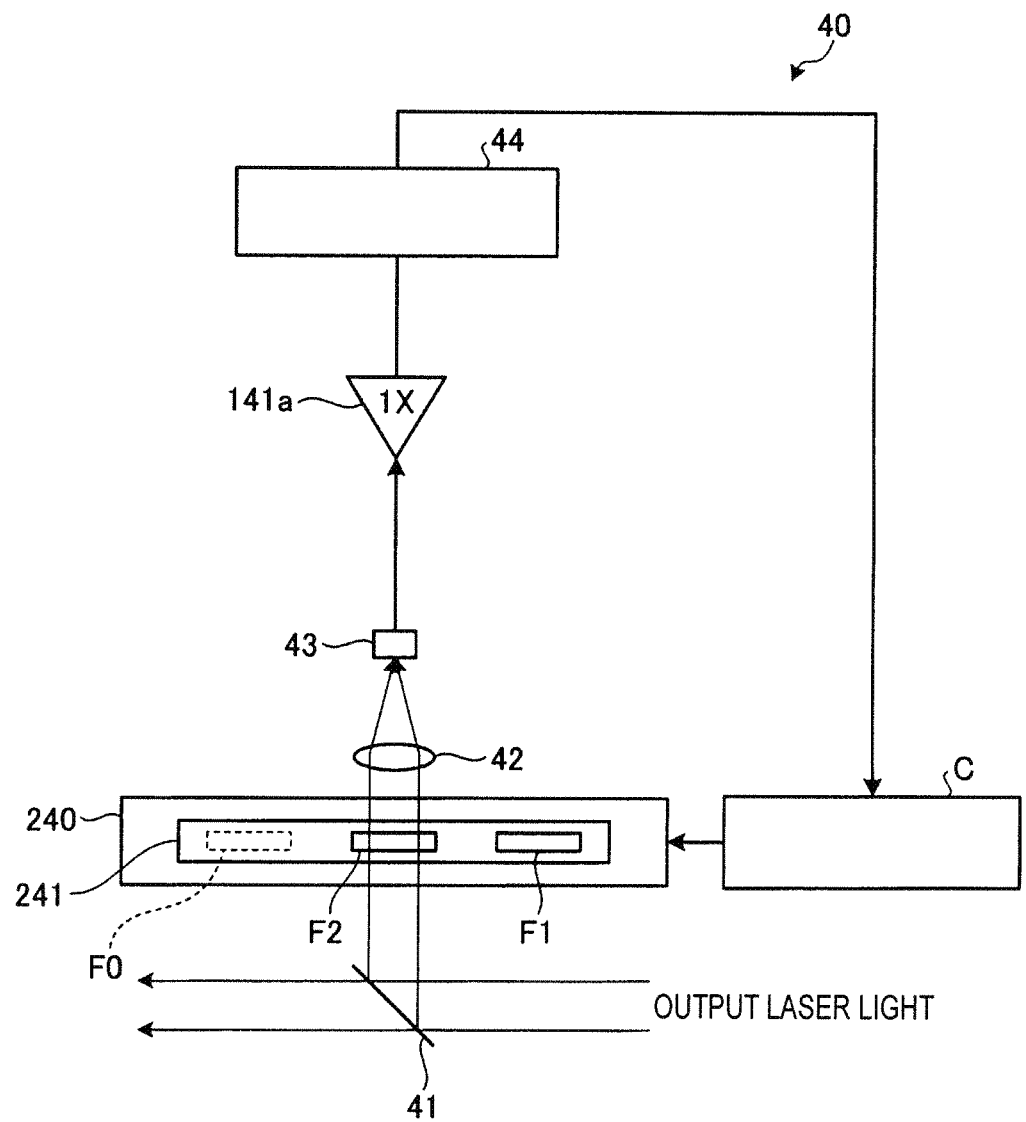
FIG. 37 schematically illustrates another configuration of a dynamic range switching mechanism in a laser device for an exposure apparatus according to the fifth embodiment of this disclosure.

FIG. 37 is a schematic diagram illustrating another example of an energy sensor unit that includes a dynamic range switching mechanism. As shown in FIG. 37, a dynamic range switching mechanism 240 may include multiple filters F1 and F2, arranged along the lengthwise direction of a stage 241 and each having different transmittances, and may be provided between the beam splitter 41 and the collecting lens 42. Note that F0 indicates a region with no filter.

With this energy sensor unit 40, the arrangement of the filters F1 and F2 having different transmittances and no filter (F0) may be changed along the optical axis of the sensor by sliding the stage 241. The movement of the stage 241 may be driven by the laser controller C.

According to the embodiments and the modifications in this disclosure, it is possible to increase the dynamic range of laser output for an exposure apparatus without greatly affecting the configuration of the device, while also suppressing the wasteful consumption of energy, and without shortening the life span of the amplifier stage.

Note that it is also possible to combine the aforementioned embodiments and modifications as appropriate.

What is claimed is:

1. A laser device for an exposure apparatus, the device comprising:

a MOPA-type or MOPO-type laser device including a seed laser and at least one gas discharge-pumped amplifier stage that receives output light from the seed laser as an input, amplifies the light, and outputs the amplified light to the exposure apparatus;

an output energy detector configured to detect energy of the amplified light outputted from the gas discharge-pumped amplifier stage;

a laser gas control device configured to control a pressure of a laser gas in the gas discharge-pumped amplifier stage;

a laser power source control device configured to control an excitation voltage to be applied to a discharge electrode in the gas discharge-pumped amplifier stage; and a laser controller configured to arrange an upper limit and a lower limit of the excitation voltage and execute a first process for controlling the laser power source control device so that energy detected by the output energy detector comes close to a target energy, the laser controller being configured to:

receive a request for changing the target energy from the exposure apparatus, execute the first process, in response to the request for changing the target energy, to change the excitation voltage from a first voltage within a range of the upper limit and the lower limit to a second voltage outside the range of the upper limit and the lower limit, begin to execute, while executing the first process in response to change in the energy detected by the output energy detector, a second process for controlling the laser gas control device so that the excitation voltage comes within the range of the upper limit and the lower limit from the second voltage, execute, while executing the first process and the second process, a third process for determining whether the excitation voltage has come within the range of the upper limit and the lower limit, continue the second process if the excitation voltage has not come within the range of the upper limit and the lower limit, and stop the second process if the excitation voltage has come to a third voltage within the range of the upper limit and the lower limit, wherein, in the second process, when the excitation voltage is higher than the upper limit, the laser controller controls the laser gas control device so as to inject the laser gas into the gas discharge-pumped amplifier stage, and when the excitation voltage is lower than the lower limit, the laser controller controls the laser gas control device so as to vent the laser gas from the gas discharge-pumped amplifier stage.

2. The laser device according to claim 1, wherein when the laser controller receives the request from the exposure apparatus, the laser controller refreshes the laser gas in the gas discharge-pumped amplifier stage using the laser gas control device prior to executing the second process in response to the request.

3. The laser device according to claim 1, wherein the output energy detector includes a dynamic range switching mechanism that switches a dynamic range for energy detection of the amplified light outputted from the laser device.

4. The laser device according to claim 1, further comprising:

a shutter located on a laser path of the amplified light outputted from the laser device to the exposure apparatus and configured to block the amplified light outputted from the laser device, wherein when the laser controller receives the request from the exposure apparatus, the laser controller controls the shutter to block the amplified light outputted from the laser device until the excitation voltage controlled by the laser controller comes within the range of the upper limit and the lower limit.

5. The laser device according to claim 1, wherein the gas discharge-pumped amplifier stage includes a ring resonator.

6. The laser device according to claim 1, wherein the gas discharge-pumped amplifier stage includes a Fabry-Perot resonator.

7. The laser device according to claim 1, wherein the laser gas control device controls a partial pressure of $F_2$ gas in the laser gas.

8. The laser device according to claim 1, wherein the laser gas control device controls a total pressure of the laser gas.

9. The laser device according to claim 1, wherein the third voltage is between the first voltage and the second voltage.

10. The laser device according to claim 1, wherein the laser controller sends a signal to notify that an adjustment oscillation is to start to the exposure apparatus before controlling the laser power source control device to change the excitation voltage from the first voltage to the second voltage, and the laser controller sends another signal to notify that the adjustment oscillation has ended to the exposure apparatus after controlling the laser power source control device to change the excitation voltage from the second voltage to the third voltage.

11. A method of controlling a laser device for an exposure apparatus, the laser device having a MOPA-type or MOPO-type laser device including a seed laser and at least one gas discharge-pumped amplifier stage that receives output light from the seed laser as an input, amplifies the light and outputs the amplified light to the exposure apparatus, an output energy detector configured to detect energy of the amplified light outputted from the gas discharge-pumped amplifier stage, a laser gas control device configured to control a pressure of a laser gas in the gas discharge-pumped amplifier stage, a laser power source control device configured to control an excitation voltage to be applied to a discharge electrode in the gas discharge-pumped amplifier stage, and a laser controller configured to control the laser gas control device and the laser power source control device, the method comprising:

arranging, by the laser controller, an upper limit and a lower limit of the excitation voltage;

executing, by the laser controller, a first process for controlling the laser power source control device so that energy detected by the output energy detector comes close to a target energy;

receiving, by the laser controller, a request for changing the target energy from the exposure apparatus;

executing, by the laser controller, in response to the request for changing the target energy, a first process to change the excitation voltage from a first voltage within a range of the upper limit and the lower limit to a second voltage outside the range of the upper limit and the lower limit;

beginning to execute, by the laser controller, while executing the first process in response to change in the energy detected by the output energy detector, a second process for controlling the laser gas control device so that the excitation voltage comes within the range of the upper limit and the lower limit from the second voltage;

executing, by the laser controller, while executing the first process and the second process, a third process for determining whether the excitation voltage has come within the range of the upper limit and the lower limit;

continuing, by the laser controller, the second process if the excitation voltage has not come within the range of the upper limit and the lower limit; and stopping, by the laser controller, the second process if the excitation voltage has come to a third voltage within the range of the upper limit and the lower limit, wherein, in the second process, when the excitation voltage is higher than the upper limit, the laser controller controls the laser gas control device so as to inject the laser gas into the gas discharge-pumped amplifier stage, and when the excitation voltage is lower than the lower limit, the laser controller controls the laser gas control device so as to vent the laser gas from the gas discharge-pumped amplifier stage.

12. The method according to claim 11, wherein the third voltage is between the first voltage and the second voltage.

13. The method according to claim 11, further comprising:

sending, by the laser controller, a signal to notify that an adjustment oscillation is to start to the exposure apparatus before controlling the laser power source control device to change the excitation voltage from the first voltage to the second voltage, and sending, by the laser controller, another signal to notify that the adjustment oscillation has ended to the exposure apparatus after controlling the laser power source control device to change the excitation voltage from the second voltage to the third voltage.

14. A laser device for an exposure apparatus, the device comprising:

a MOPA-type or MOPO-type laser device including a seed laser and at least one gas discharge-pumped amplifier stage that receives output light from the seed laser as an input, amplifies the light, and outputs the amplified light to the exposure apparatus;

an output energy detector configured to detect energy of the amplified light outputted from the gas discharge-pumped amplifier stage;

a laser gas control device configured to control a pressure of a laser gas in the gas discharge-pumped amplifier stage;

a laser power source control device configured to control an excitation voltage to be applied to a discharge electrode in the gas discharge-pumped amplifier stage; and a laser controller configured to
arrange an upper limit and a lower limit of the excitation voltage,
execute a first process for controlling the laser power source control device so that energy detected by the output energy detector comes close to a first, non-zero target energy,
receive, from the exposure apparatus, a request for changing the target energy from the first target energy to a second, non-zero target energy,
control the laser power source control device to change the excitation voltage as a step change at a point in time to move from a first voltage within a range of the upper limit and the lower limit to a second voltage outside the range of the upper limit and the lower limit, so that energy detected by the output energy detector comes close to the second target energy as a step change,
execute, while controlling the laser power source control device so that energy detected by the output energy detector keeps close to the second target energy, a second process for controlling the laser gas control device so that the excitation voltage ramps to come to a third voltage within the range of the upper limit and the lower limit, and
execute, while executing the first process and the second process, a third process for determining whether the excitation voltage has come within the range of the upper limit and the lower limit, wherein, in the second process
when the excitation voltage is higher than the upper limit, the laser controller controls the laser gas control device so as to inject the laser gas into the gas discharge-pumped amplifier stage, and when the excitation voltage is lower than the lower limit, the laser controller controls the laser gas control device so as to vent the laser gas from the gas discharge-pumped amplifier stage.

15. The laser device according to claim 14, further comprising:
a shutter located on a laser path of the amplified light outputted from the laser device to the exposure apparatus and configured to block the amplified light outputted from the laser device,
wherein when the laser controller receives the request from the exposure apparatus, the laser controller controls the shutter to block the amplified light outputted from the laser device until the excitation voltage controlled by the laser controller comes within the range of the upper limit and the lower limit.

16. The laser device according to claim 14, wherein the third voltage is between the first voltage and the second voltage.

17. The laser device according to claim 14, wherein
the laser controller sends a signal to notify that an adjustment oscillation is to start to the exposure apparatus before controlling the laser power source control device to change the excitation voltage from the first voltage to the second voltage, and
the laser controller sends another signal to notify that the adjustment oscillation has ended to the exposure apparatus after controlling the laser power source control device to change the excitation voltage from the second voltage to the third voltage.

18. A method of controlling a laser device for an exposure apparatus, the laser device having a MOPA-type or MOPO-type laser device including a seed laser and at least one gas discharge-pumped amplifier stage that receives output light from the seed laser as an input, amplifies the light and outputs the amplified light to the exposure apparatus, an output energy detector configured to detect energy of the amplified light outputted from the gas discharge-pumped amplifier stage, a laser gas control device configured to control a pressure of a laser gas in the gas discharge-pumped amplifier stage, a laser power source control device configured to control an excitation voltage to be applied to a discharge electrode in the gas discharge-pumped amplifier stage, and a laser controller configured to control the laser gas control device and the laser power source control device, the method comprising:
arranging, by the laser controller, an upper limit and a lower limit of the excitation voltage;
executing, by the laser controller, a first process for controlling the laser power source control device so that energy detected by the output energy detector comes close to a first, non-zero target energy;
receiving, by the laser controller, from the exposure apparatus, a request for changing the target energy from the first target energy to a second, non-zero target energy;
controlling, by the laser controller, the laser power source control device to change the excitation voltage as a step change at a point in time to move from within a range of the upper limit and the lower limit to outside the range of the upper limit and the lower limit, so that energy detected by the output energy detector comes close to the second target energy as a step change;
executing, by the laser controller, while controlling the laser power source control device so that energy detected by the output energy detector keeps close to the second target energy, a second process for controlling the laser gas control device so that the excitation voltage ramps to come within the range of the upper limit and the lower limit; and
executing, by the laser controller, a third process for determining whether the excitation voltage has come within the range of the upper limit and the lower limit while executing the first process and the second process, wherein, in the second process
when the excitation voltage is higher than the upper limit, the laser controller controls the laser gas control device so as to inject the laser gas into the gas discharge-pumped amplifier stage, and when the excitation voltage is lower than the lower limit, the laser controller controls the laser gas control device so as to vent the laser gas from the gas discharge-pumped amplifier stage.

19. The method according to claim 18, wherein the third voltage is between the first voltage and the second voltage.

20. The method according to claim 18, further comprising:
sending, by the laser controller, a signal to notify that an adjustment oscillation is to start to the exposure apparatus before controlling the laser power source control device to change the excitation voltage from the first voltage to the second voltage, and sending, by the laser controller, another signal to notify that the adjustment oscillation has ended to the exposure apparatus after controlling the laser power source control device to change the excitation voltage from the second voltage to the third voltage.

* * * * *